United States Patent
Lin et al.

(10) Patent No.: US 12,376,339 B2
(45) Date of Patent: Jul. 29, 2025

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Po-Shao Lin, Taipei (TW); Yi-Hsiu Liu, Taipei (TW); Chih-Chung Chang, Mingjian Township, Nantou County (TW); Chung-Ting Ko, Taipei (TW); Sung-En Lin, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 746 days.

(21) Appl. No.: 17/685,139

(22) Filed: Mar. 2, 2022

(65) Prior Publication Data
US 2023/0282723 A1 Sep. 7, 2023

(51) Int. Cl.
*H01L 29/423* (2006.01)
*H01L 27/088* (2006.01)
(Continued)

(52) U.S. Cl.
CPC ....... *H10D 30/6735* (2025.01); *H10D 62/118* (2025.01); *H10D 64/017* (2025.01); *H10D 64/258* (2025.01); *H10D 84/83* (2025.01)

(58) Field of Classification Search
CPC ............... H01L 27/088; H01L 27/0886; H01L 27/0924; H01L 27/1211; H01L 29/0665; H01L 29/0669; H01L 29/0673; H01L 29/41775; H01L 29/41791; H01L 29/42392; H01L 29/66439; H01L 29/66545; H01L 29/66795; H01L 29/775; H01L 29/785; H01L 29/7851; H01L 29/7853; H01L 29/7855; H01L 2029/7858; H10D 30/014; H10D 30/024; H10D 30/62; H10D 30/6211; H10D 30/6212; H10D 30/6213; H10D 30/6735; H10D 62/118; H10D 62/119; H10D 62/121; H10D 64/017; H10D 64/258; H10D 84/0158; H10D 84/0193; H10D 84/83; H10D 84/834; H10D 84/853
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — David C Spalla
(74) *Attorney, Agent, or Firm* — Birch, Stewart, Kolasch & Birch, LLP

(57) ABSTRACT

A method for forming a semiconductor device structure is provided. The semiconductor device structure includes a first fin structure formed over a substrate, and the first fin structure includes a plurality of first nanostructures stacked in a vertical direction. The semiconductor device structure further includes a second fin structure formed over the substrate, and the second fin structure includes a plurality of second nanostructures stacked in a vertical direction. The semiconductor device structure further includes a dummy fin structure between the first fin structure and the second fin structure. The dummy fin structure includes a first etching stop layer between a bottom portion and a top portion.

20 Claims, 31 Drawing Sheets

(51) Int. Cl.
*H01L 29/06* (2006.01)
*H01L 29/417* (2006.01)
*H01L 29/66* (2006.01)
*H10D 30/67* (2025.01)
*H10D 62/10* (2025.01)
*H10D 64/01* (2025.01)
*H10D 64/23* (2025.01)
*H10D 84/83* (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2020/0328208 A1* | 10/2020 | Chiang ........... H01L 21/823431 |
| 2021/0057525 A1* | 2/2021 | Chiang ........... H01L 21/823481 |
| 2021/0217654 A1* | 7/2021 | Xie ................ H01L 21/823481 |

\* cited by examiner

SEMICONDUCTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3E' shows a cross-sectional representation of a semiconductor device structure, in accordance with some embodiments of the disclosure.

DETAILED DESCRIPTION

Figure 1:
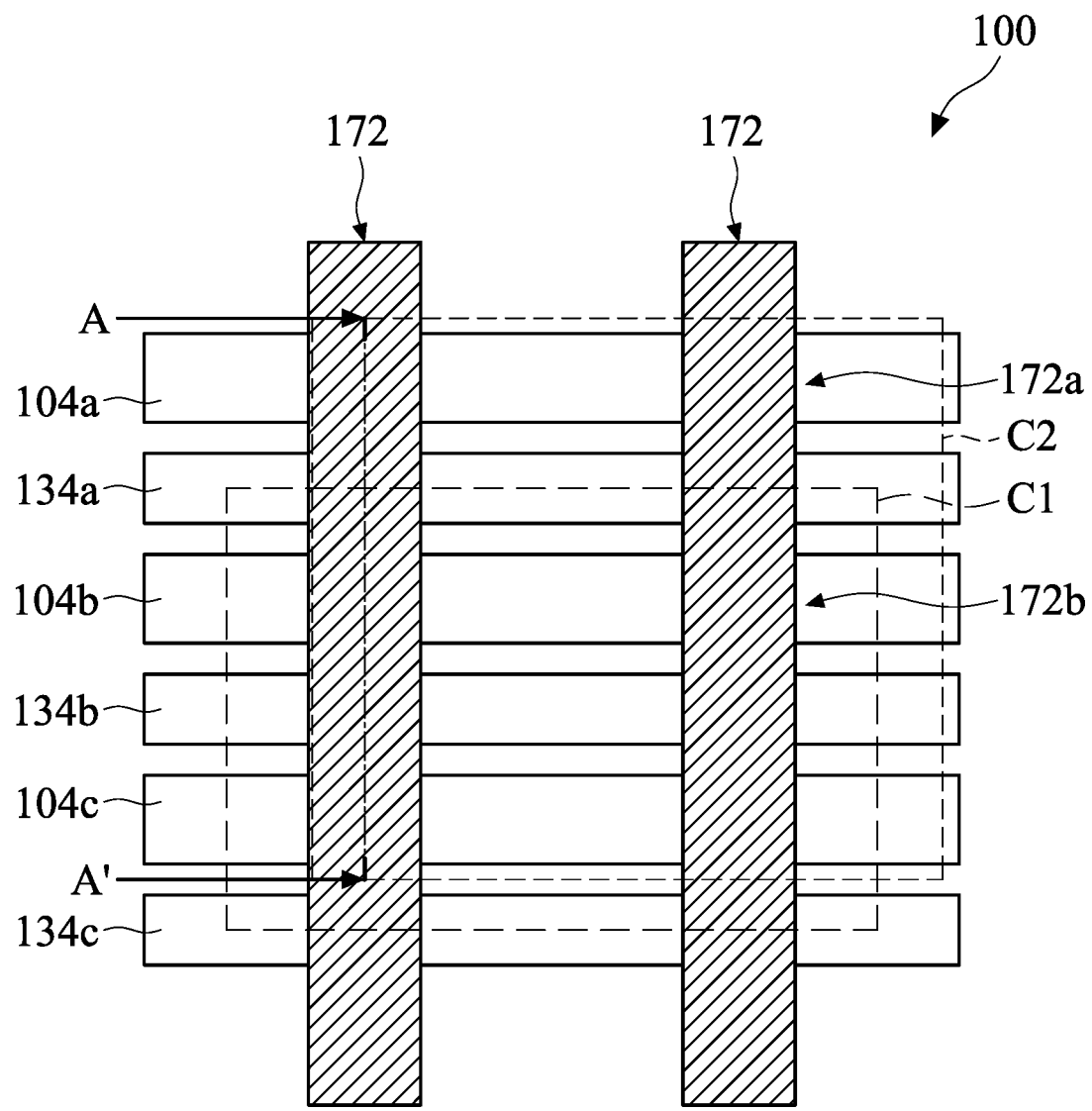
FIG. 1 shows a top view of a semiconductor structure 100, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. The semiconductor device structure may include nanostructures formed over a substrate and a gate structure wraps around the nanostructures. A first fin structure and a second fin structure is formed over the substrate, and a dummy fin structure is between the first fin structure and the second fin structure. The dummy fin structure includes an etching stop layer between the bottom portion and the top portion. The etching stop layer is used to protect the underlying layers from damage.

FIG. 1 shows a top view of a semiconductor structure 100, in accordance with some embodiments. FIG. 1 has been simplified for the sake of clarity to better understand the inventive concepts of the present disclosure. Additional features may be added in the semiconductor structure 100, and some of the features described below may be replaced, modified, or eliminated.

The semiconductor structure 100 may include multi-gate devices and may be included in a microprocessor, a memory, or other IC devices. For example, the semiconductor structure 100 may be a portion of an IC chip that include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

Figure 2A:
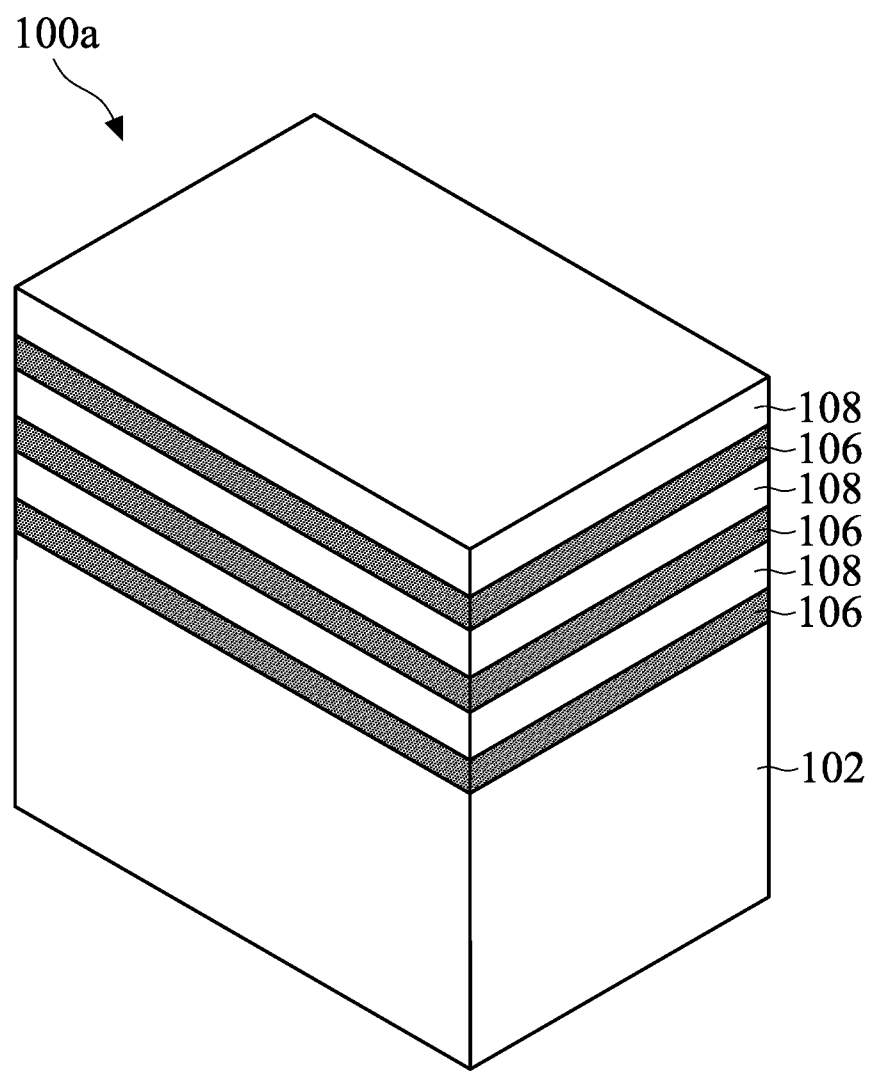
FIGS. 2A to 2U illustrate perspective views of intermediate stages of manufacturing a semiconductor structure, in accordance with some embodiments.
Figure 2B:
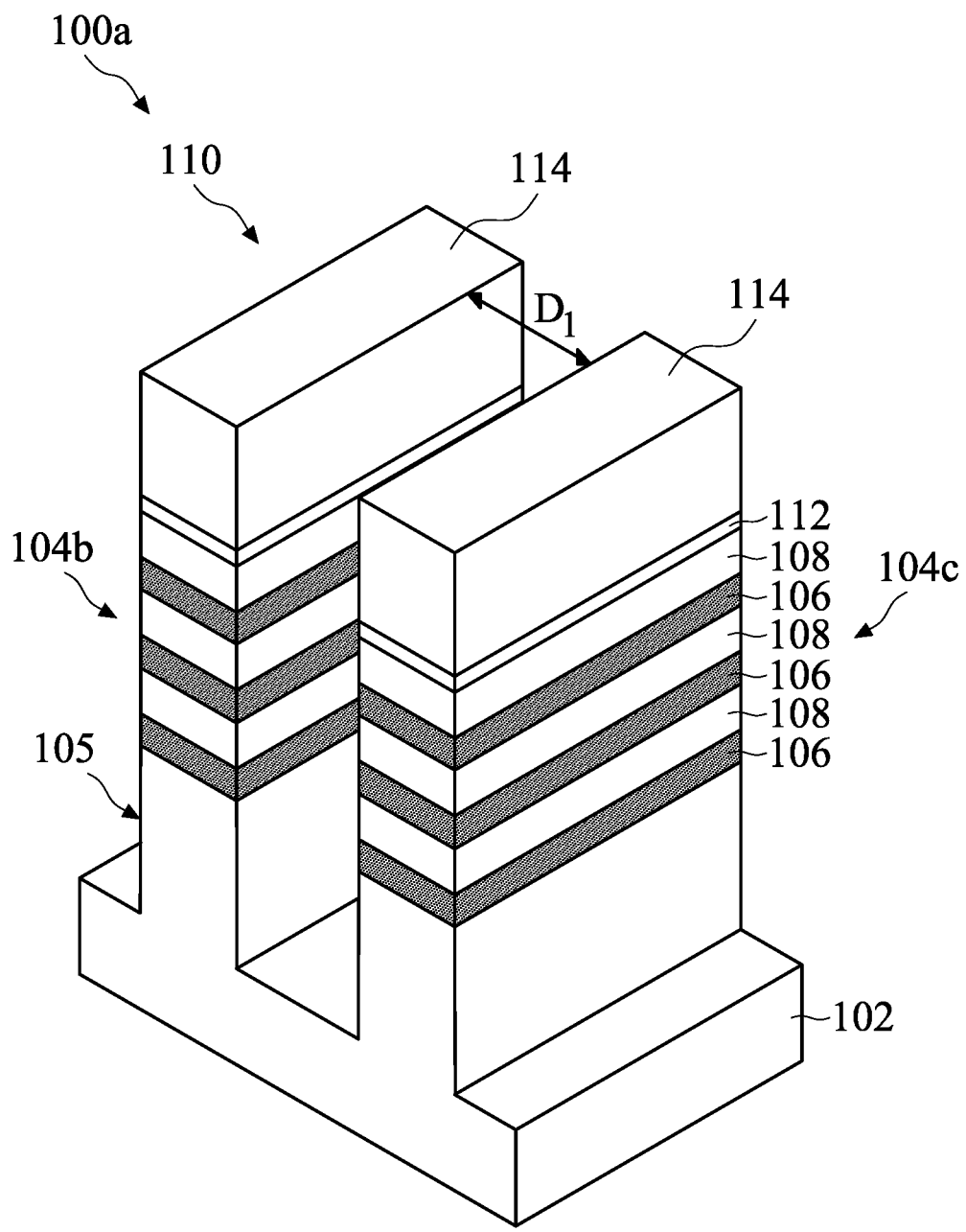
Figure 2C:
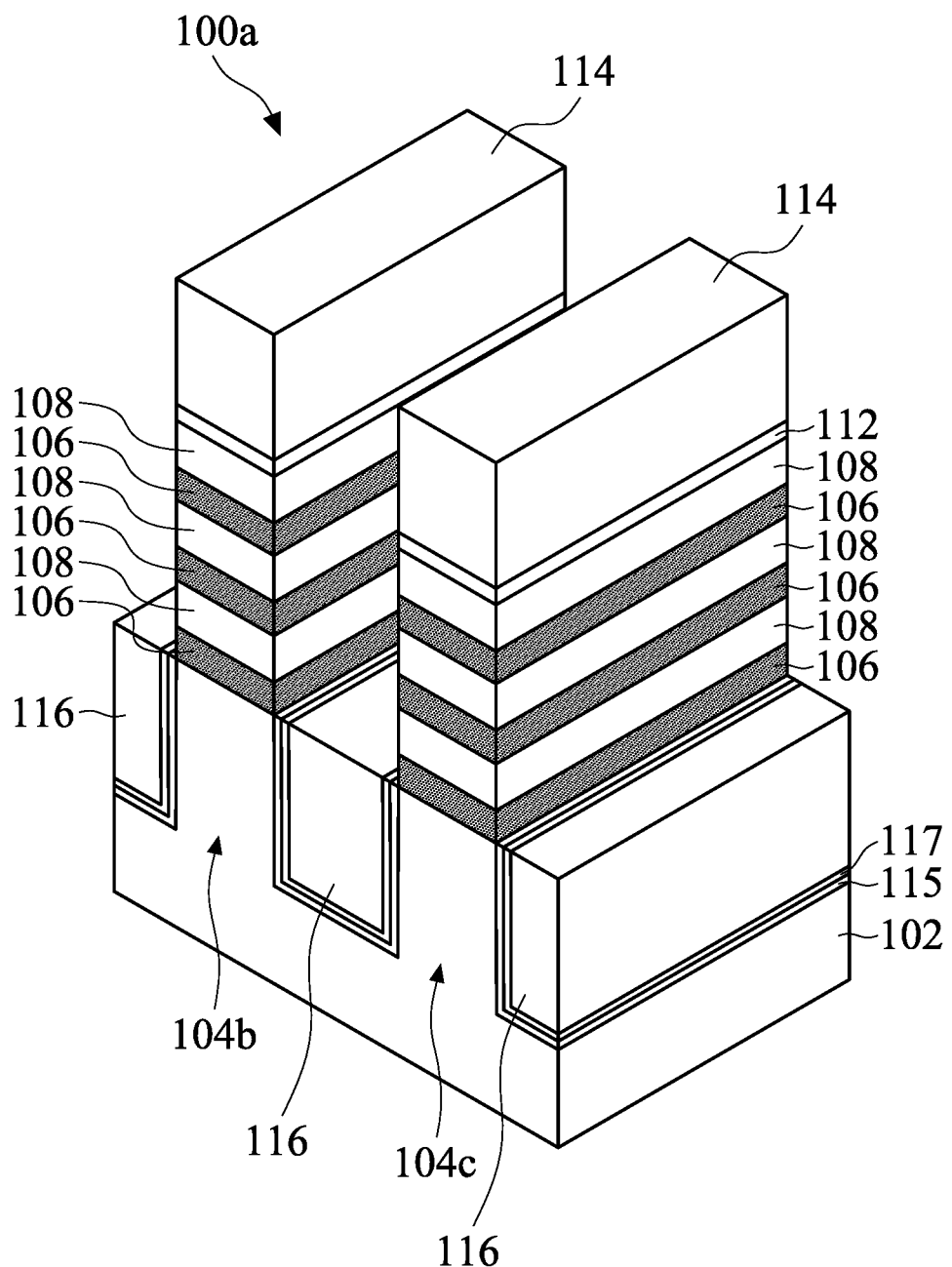
Figure 2D:
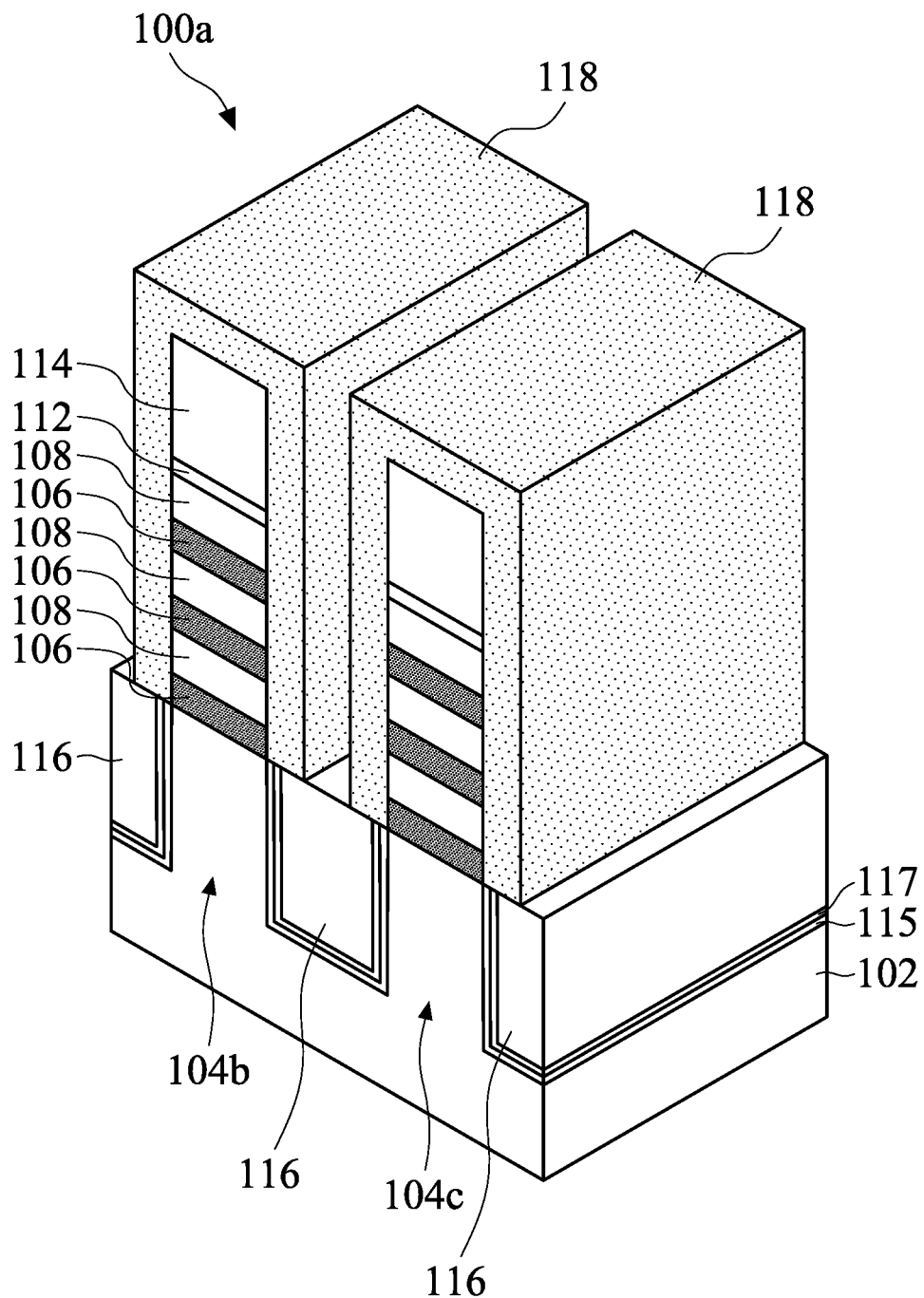
Figure 2E:
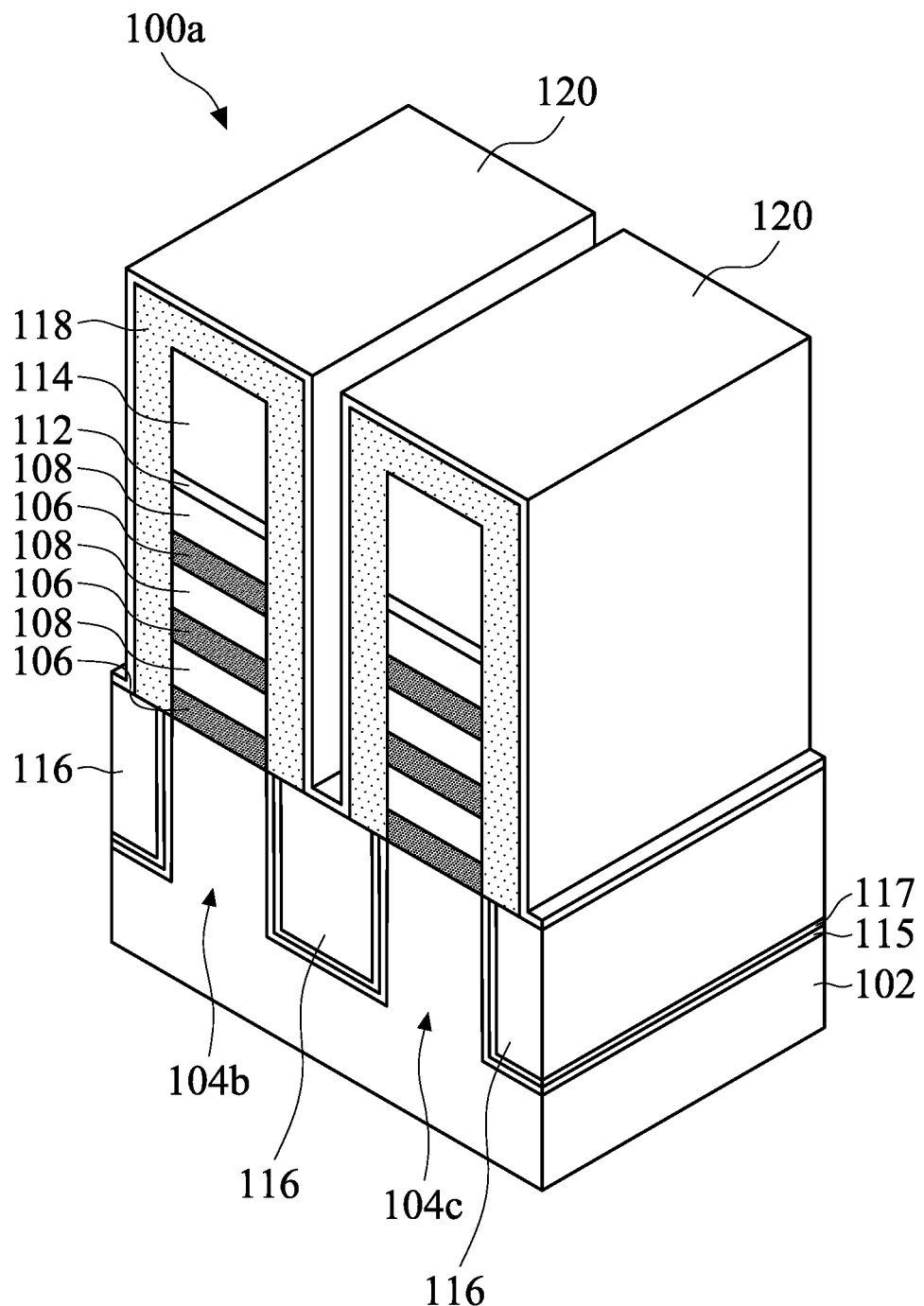
Figure 2F:
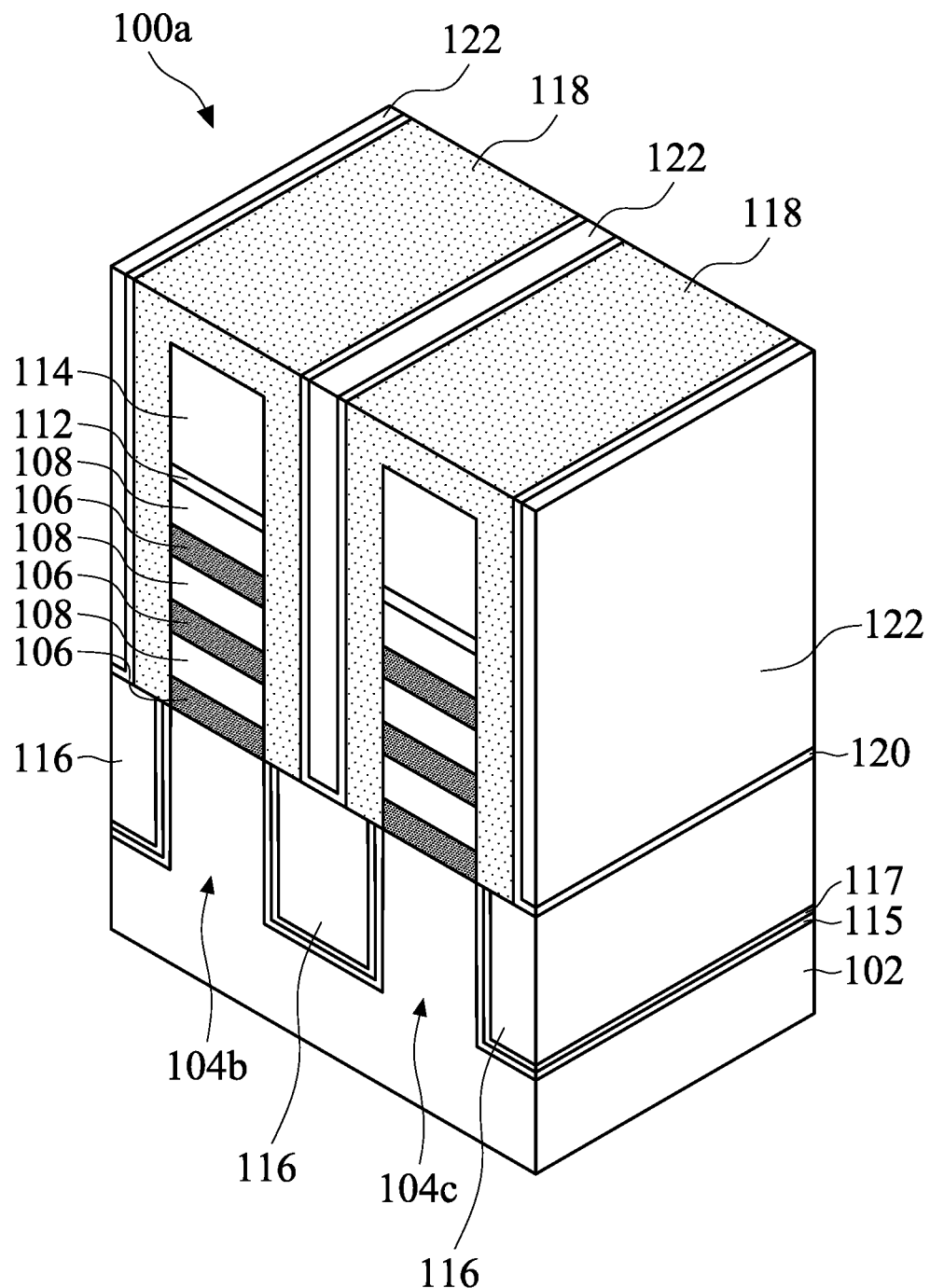
Figure 2G:
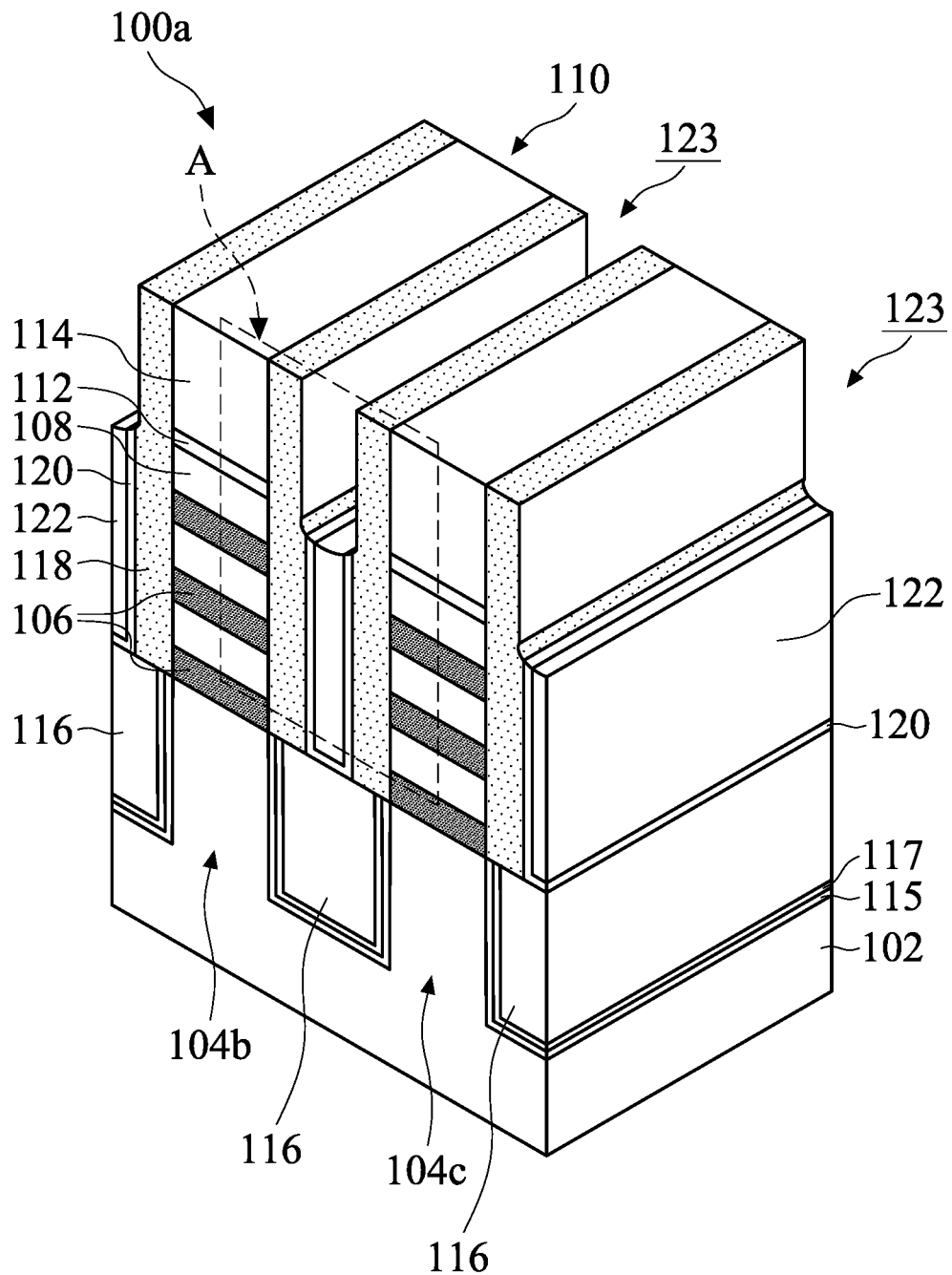
Figure 2H:
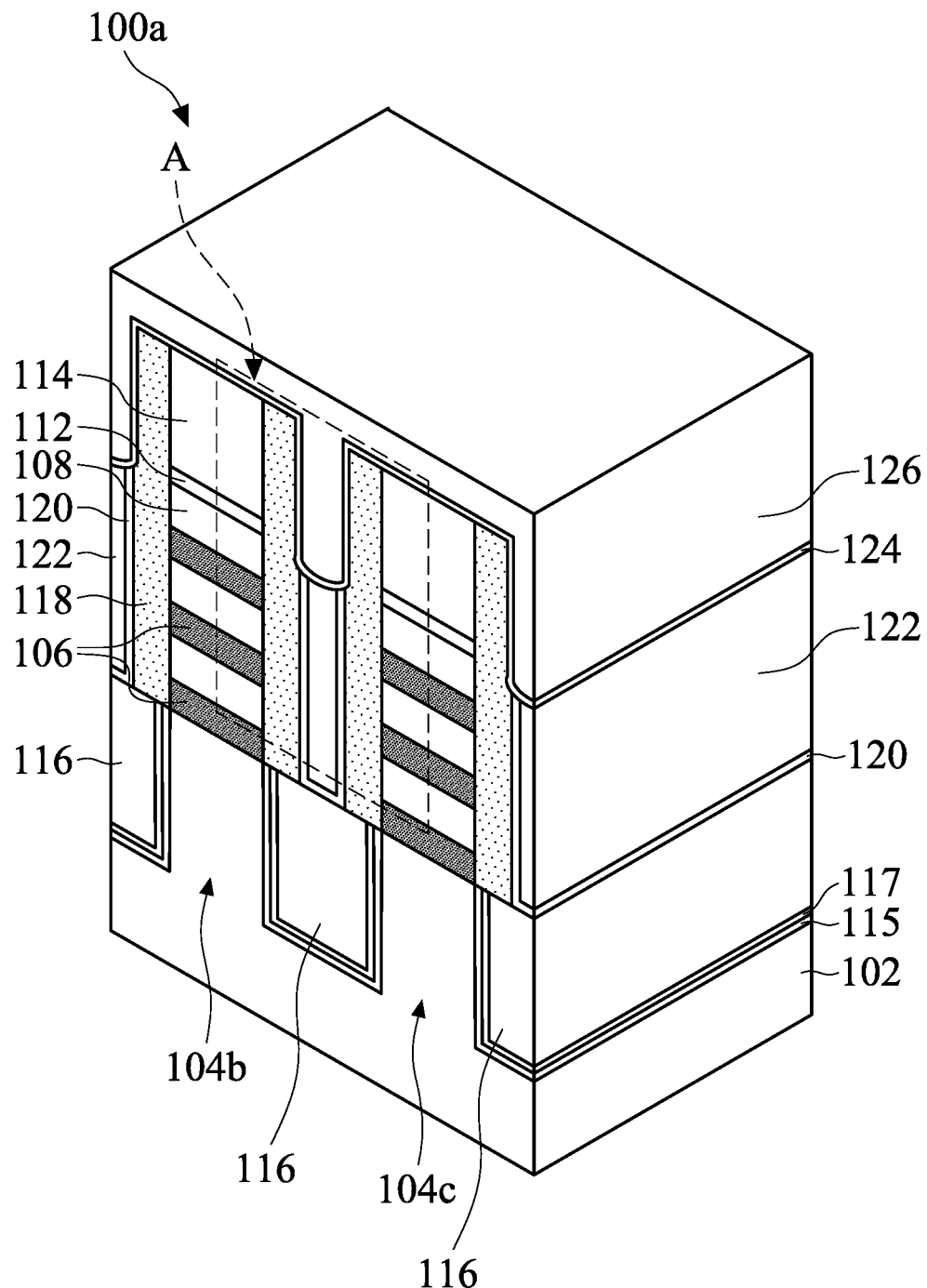
Figure 2I:
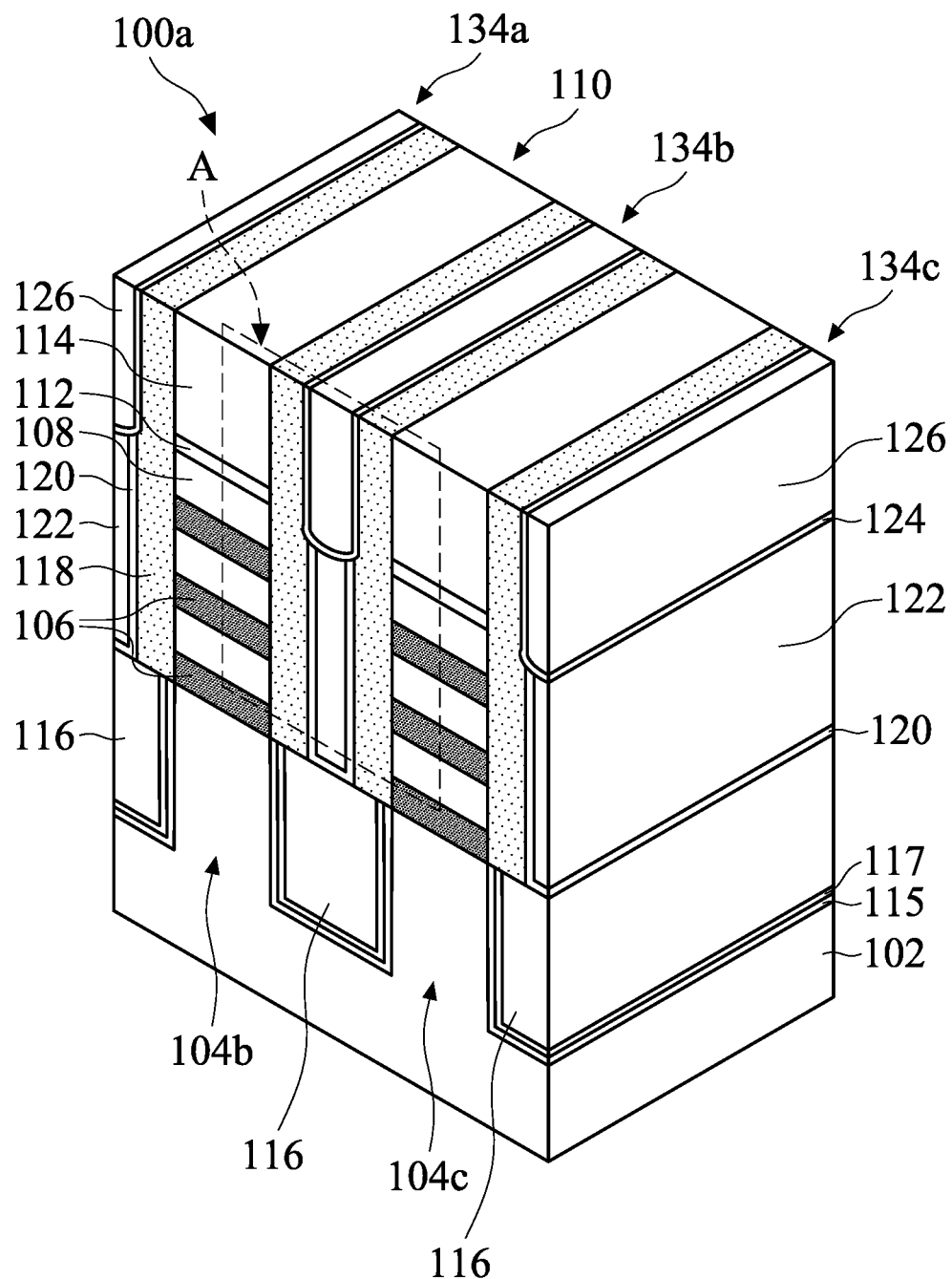
Figure 2J:
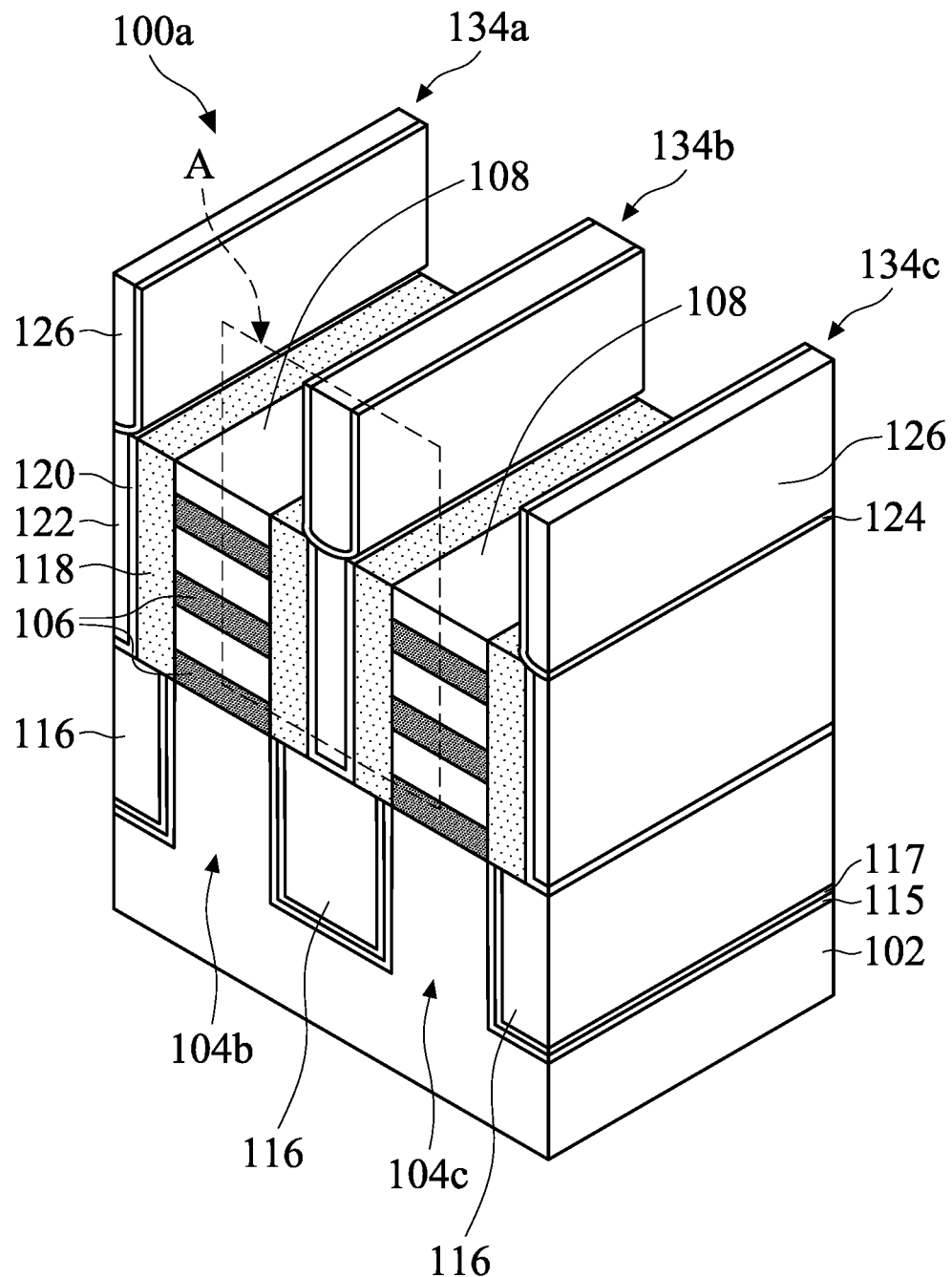
Figure 2K:
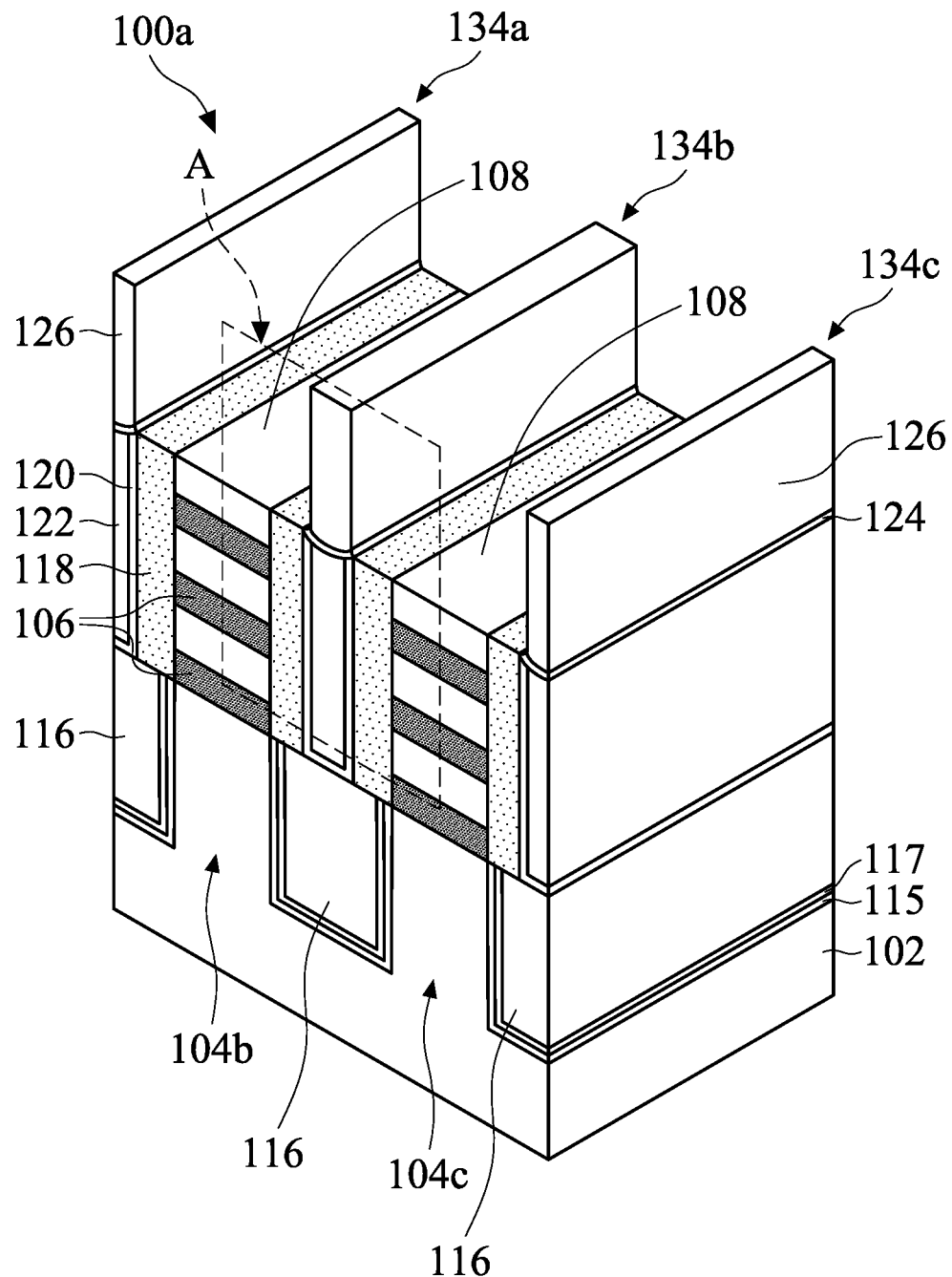
Figure 2L:
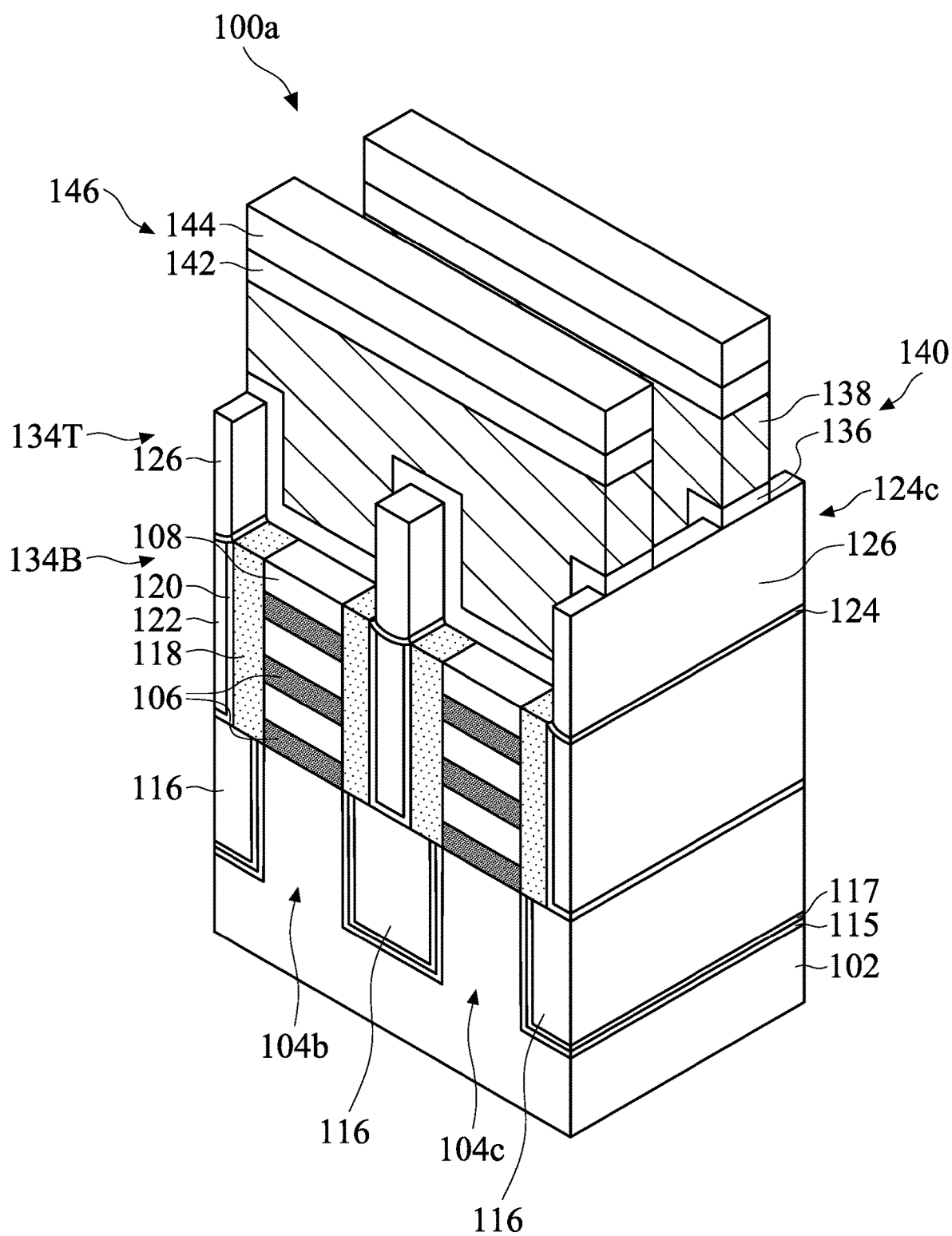
Figure 2M:
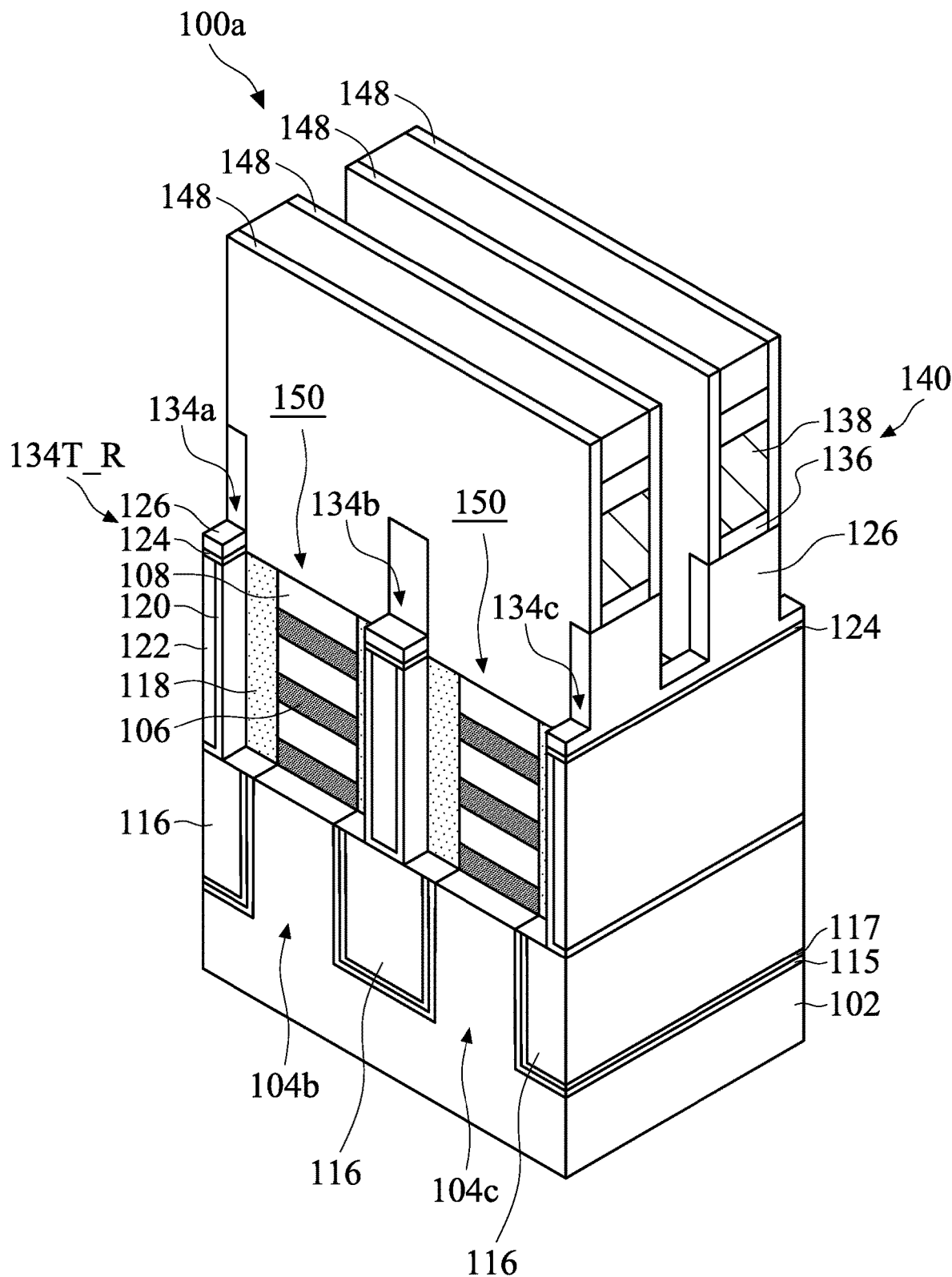
Figure 2N:
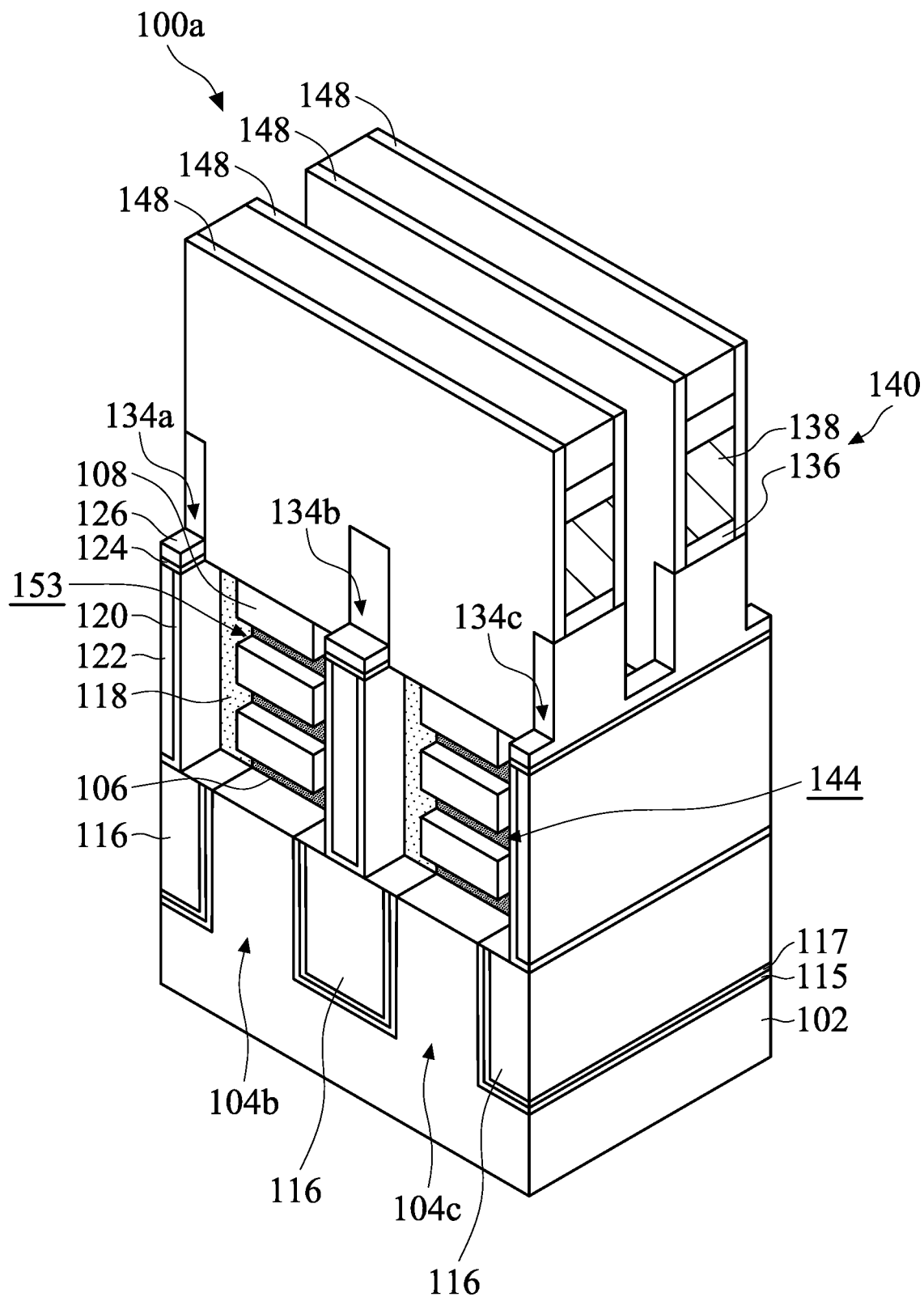
Figure 2O:
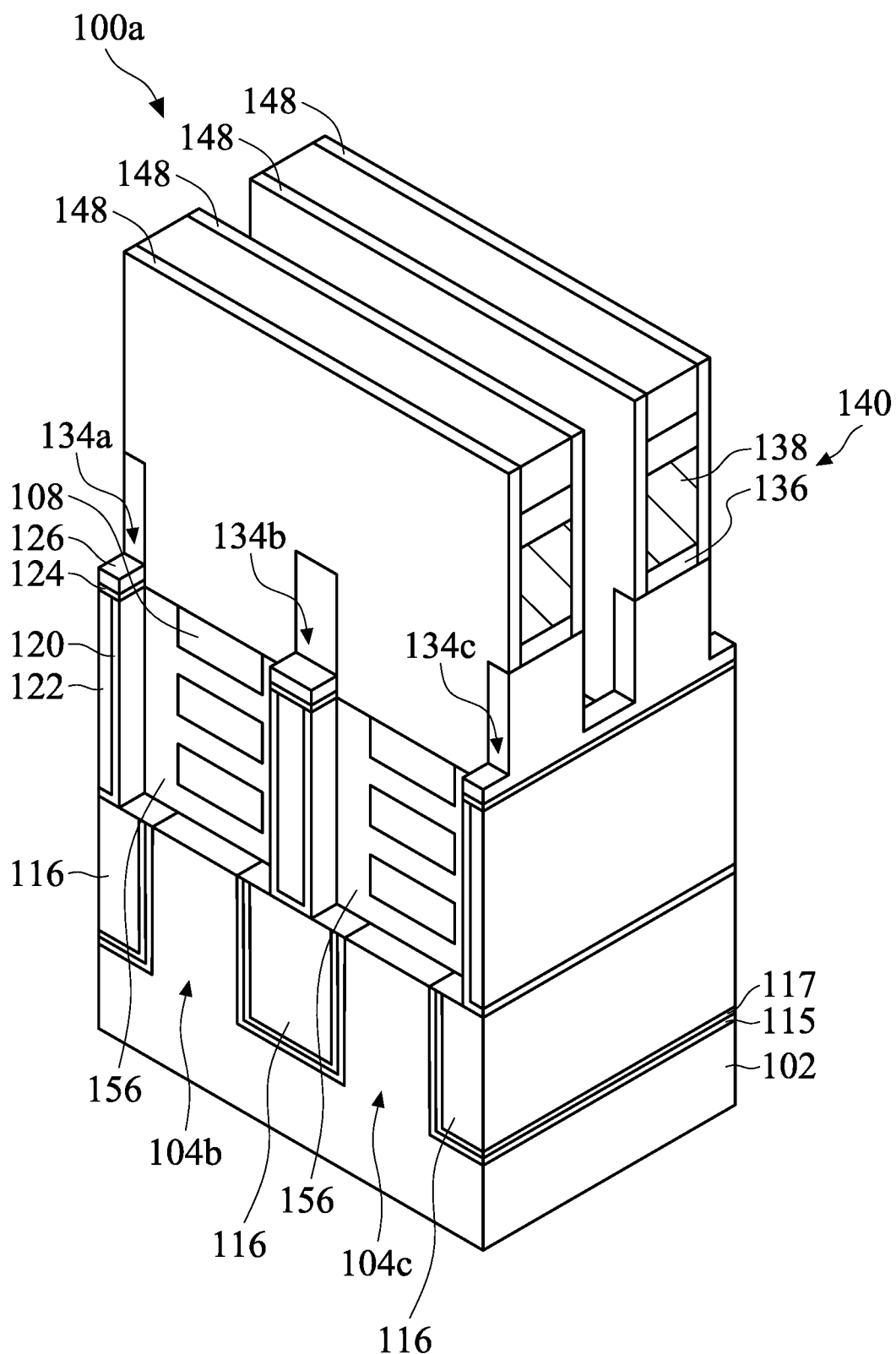
Figure 2P:
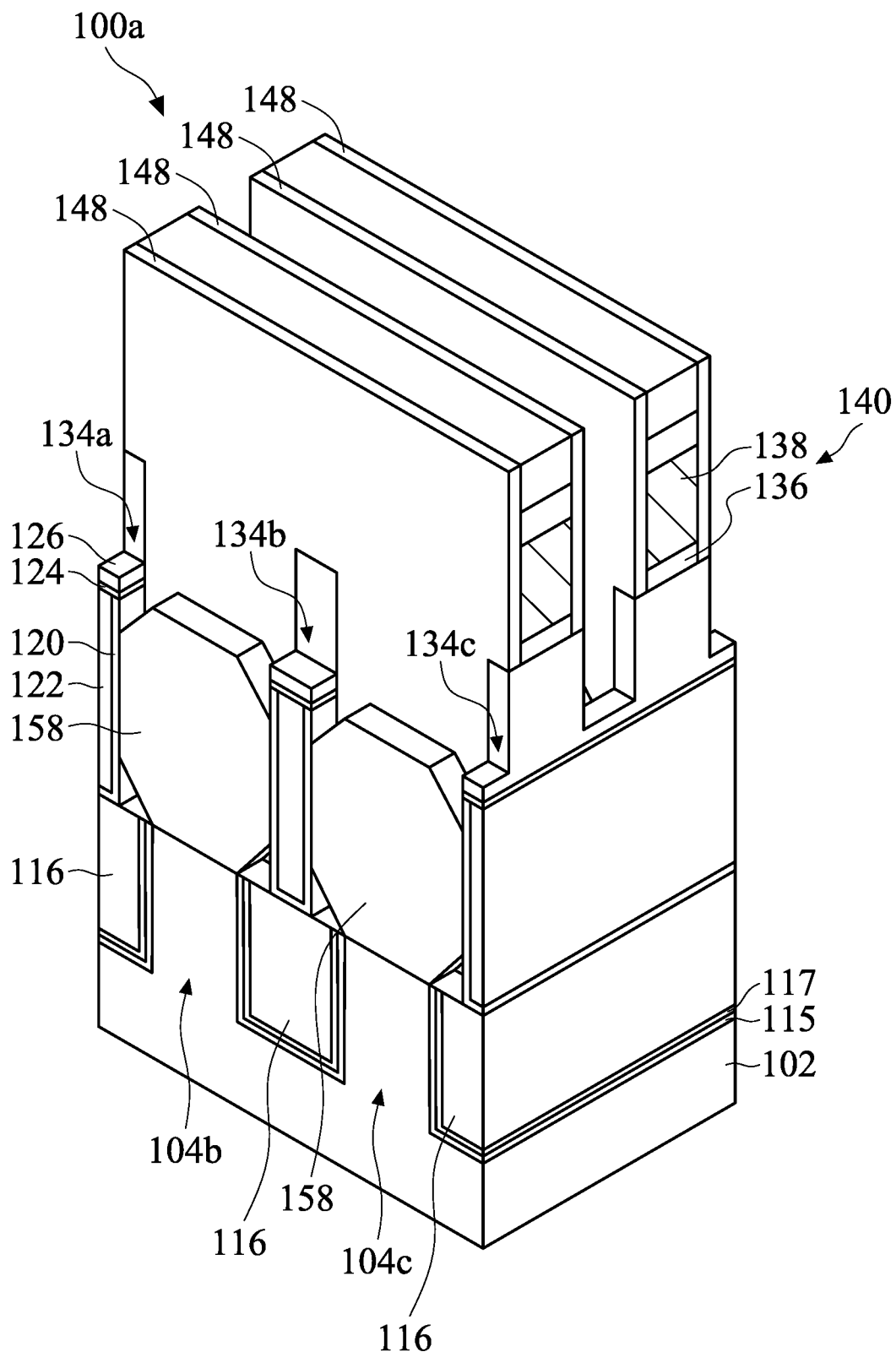
Figure 2Q:
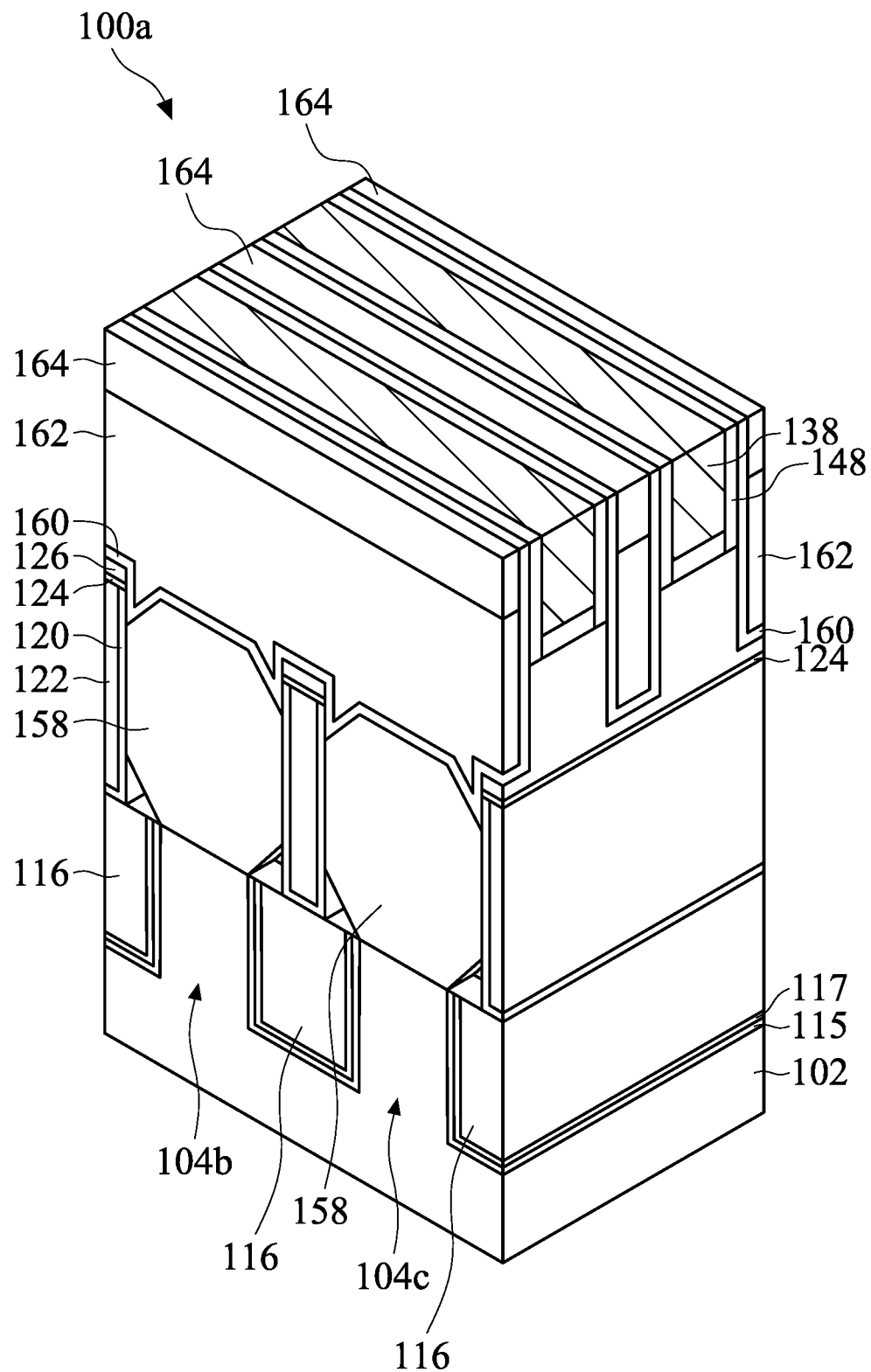
Figure 2R:
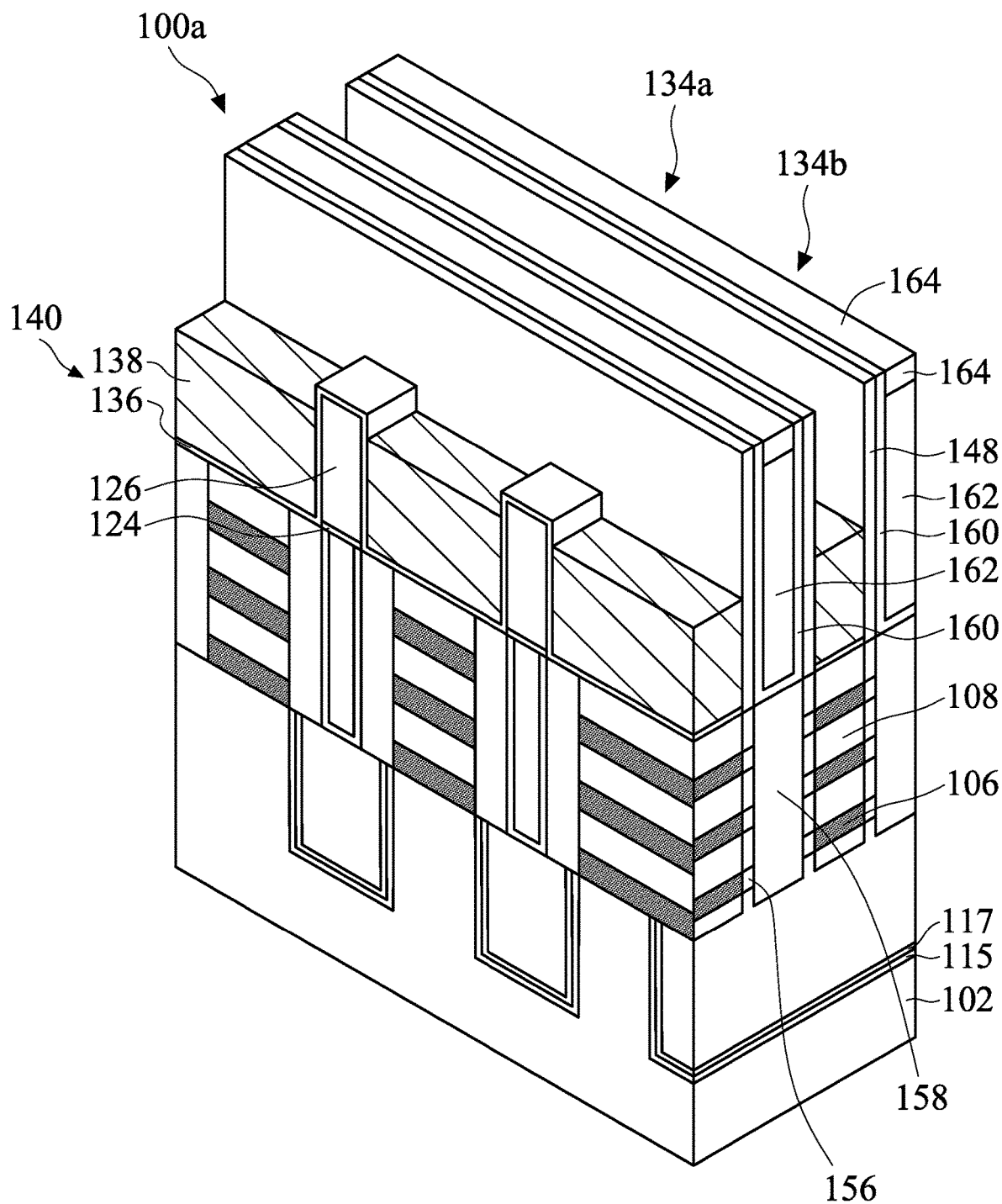
Figure 2S:
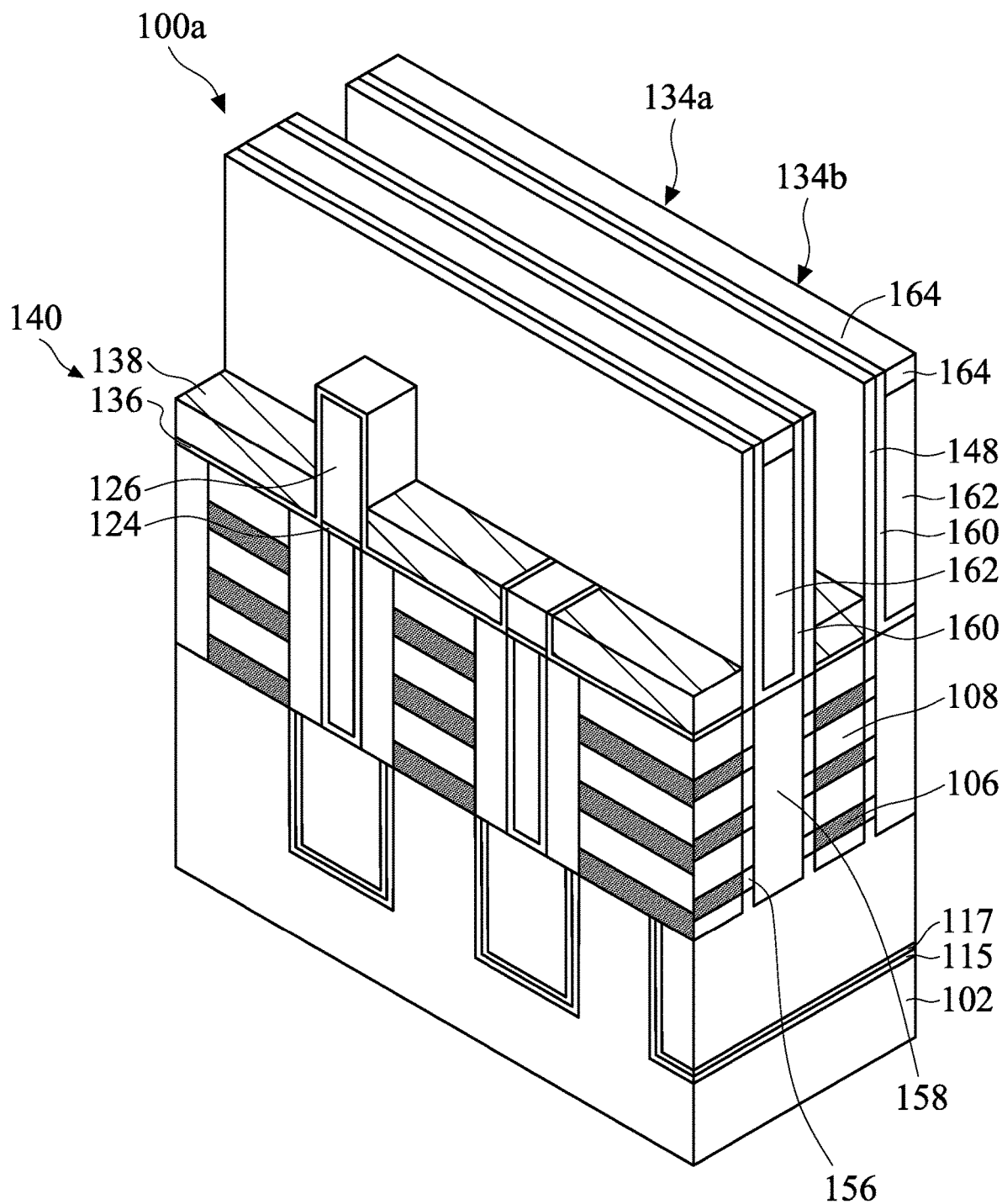
Figure 2T:
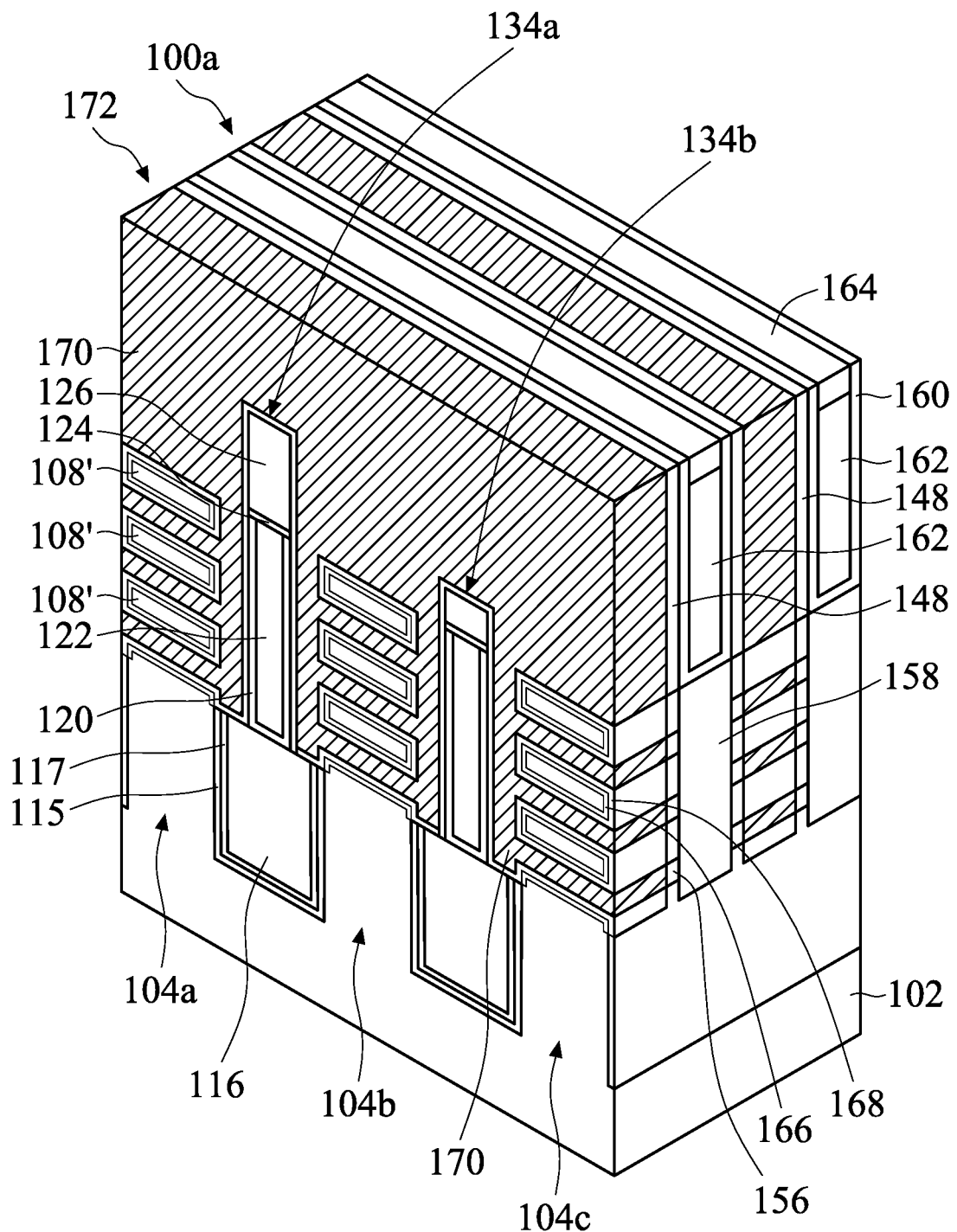
Figure 2U:
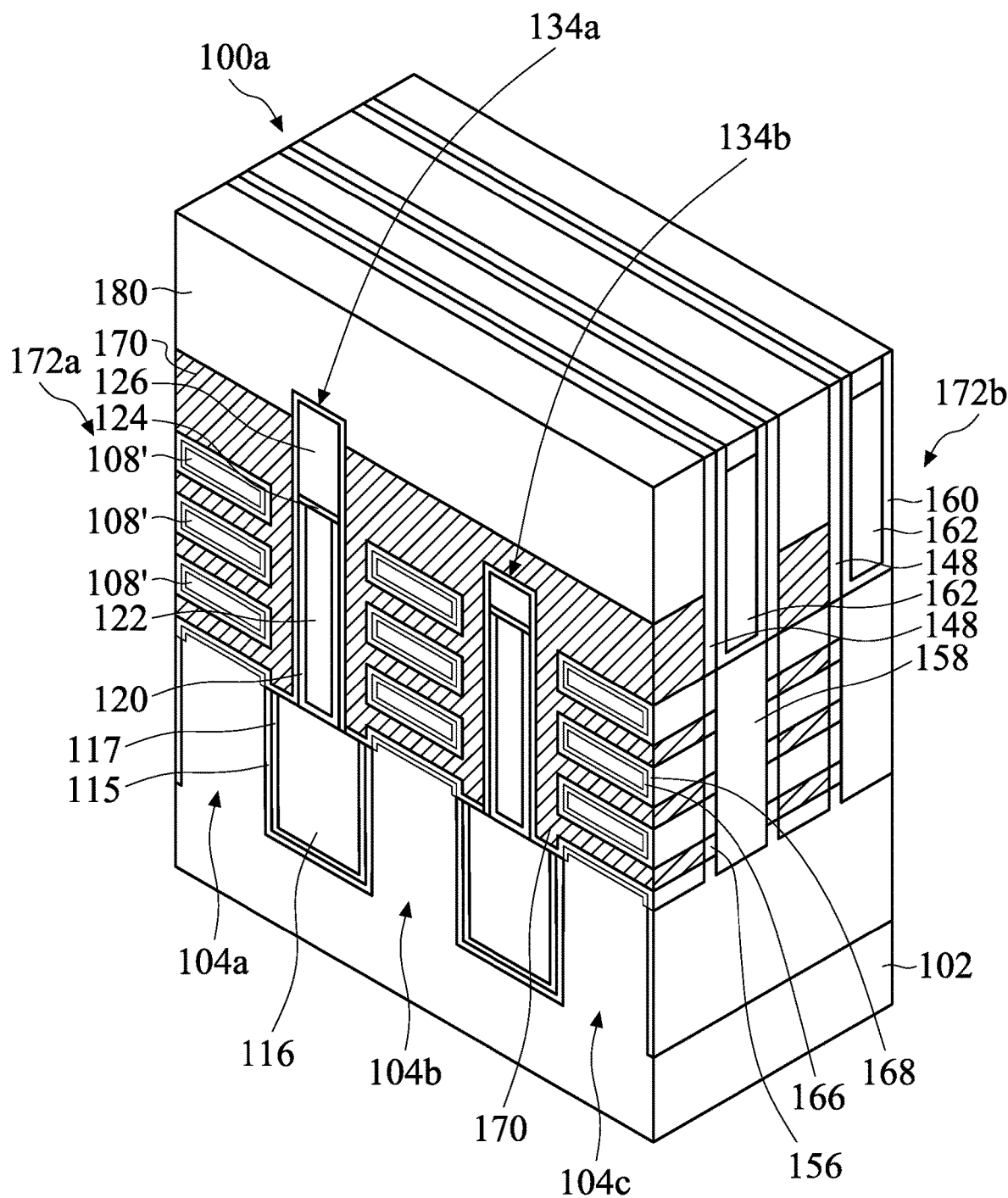

FIGS. 2A to 2U illustrate perspective views of intermediate stages of manufacturing a semiconductor structure 100a in accordance with some embodiments. More specifically, FIGS. 2A to 2Q illustrate diagrammatic perspective views of intermediate stages of manufacturing the semiconductor structure 100a, shown in the dotted line block $C_1$ of FIG. 1. FIGS. 2R to 2U illustrate diagrammatic perspective views of intermediate stages of manufacturing the semiconductor structure 100a shown in the dotted line block $C_2$ of FIG. 1 in accordance with some embodiments.

As shown in FIG. 2A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of first semiconductor layers 106 and a number of second semiconductor layers 108 are sequentially alternately formed over the substrate 102. The first semiconductor layers 106 and the second semiconductor layers 108 are vertically stacked to form a stacked nanostructures structure (or a stacked nanosheet or a stacked nanowire).

In some embodiments, the first semiconductor layers 106 and the second semiconductor layers 108 independently include silicon (Si), germanium (Ge), silicon germanium ($Si_{1-x}Ge_x$, $0.1 < x < 0.7$, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 106 and the second semiconductor layer 108 are made of different materials.

The first semiconductor layers 106 and the second semiconductor layers 108 are made of different materials having different lattice constant. In some embodiments, the first semiconductor layer 106 is made of silicon germanium ($Si_{1-x}Ge_x$, $0.1 < x < 0.7$), and the second semiconductor layer 108 is made of silicon (Si). In some other embodiments, the first semiconductor layer 106 is made of silicon (Si), and the second semiconductor layer 108 is made of silicon germanium ($Si_{1-x}Ge_x$, $0.1 < x < 0.7$).

In some embodiments, the first semiconductor layers 106 and the second semiconductor layers 108 are formed by a selective epitaxial growth (SEG) process, a chemical vapor deposition (CVD) process (e.g. low-pressure CVD (LPCVD), plasma enhanced CVD (PECVD)), a molecular epitaxy process, or another applicable process. In some embodiments, the first semiconductor layers 106 and the second semiconductor layers 108 are formed in-situ in the same chamber.

In some embodiments, the thickness of each of the first semiconductor layers 106 is in a range from about 1.5 nanometers (nm) to about 20 nm. Terms such as "about" in conjunction with a specific distance or size are to be interpreted as not to exclude insignificant deviation from the specified distance or size and may include for example deviations of up to 20%. In some embodiments, the first semiconductor layers 106 are substantially uniform in thickness. In some embodiments, the thickness of each of the second semiconductor layers 108 is in a range from about 1.5 nm to about 20 nm. In some embodiments, the second semiconductor layers 108 are substantially uniform in thickness. Where applicable, the term "substantially" may also relate to 90% or higher, such as 95% or higher, especially 99% or higher, including 100%.

Then, as shown in FIG. 2B, the first semiconductor layers 106 and the second semiconductor layers 108 are patterned to form fin structures 104b and 104c, in accordance with some embodiments of the disclosure. In some embodiments, the fin structures 104b and 104c include base fin structures 105 and the semiconductor material stacks, including the first semiconductor layers 106 and the second semiconductor layers 108, formed over the base fin structure 105.

In some embodiments, the patterning process includes forming mask structures 110 over the semiconductor material stack, and etching the semiconductor material stack and the underlying substrate 102 through the mask structure 110. In some embodiments, the mask structures 110 are a multilayer structure including a pad oxide layer 112 and a nitride layer 114 formed over the pad oxide layer 112. The pad oxide layer 112 may be made of silicon oxide, which may be formed by thermal oxidation or CVD, and the nitride layer 114 may be made of silicon nitride, which may be formed by CVD, such as LPCVD or plasma-enhanced CVD (PECVD). In some embodiments, the widths of the fin structures 104b, and 104c are substantially the same. In some embodiments, the distance $D_1$ between adjacent first structures (e.g. the fin structures 104b and 104c) is in a range from about 20 nm to about 1000 nm.

Afterwards, as shown in FIG. 2C, a liner 115 and a liner 117 are formed to cover the fin structures 104b and 104c, in accordance with some embodiments of the disclosure. In some embodiments, the liners 115 and 117 are made of different dielectric materials. In some embodiments, the liner 115 is made of oxide and the liner 117 is made of nitride. In some embodiments, the liner 115 is omitted.

Next, an insulating layer (not shown) is formed around the fin structures 104b and 104c over the liner 117. In some embodiments, the insulating layer is made of silicon oxide, silicon nitride, silicon oxynitride (SiON), another suitable insulating material, or a combination thereof.

Afterwards, as shown in FIG. 2C, the insulating layer 119 and the liners 115 and 117 are recessed to form an isolation structure 116, in accordance with some embodiments. The isolation structure 116 is configured to electrically isolate active regions (e.g. the fin structures 104b, 104c) of the semiconductor structure and is also referred to as shallow trench isolation (STI) feature in accordance with some embodiments.

Afterwards, as shown in FIG. 2D, the isolation structure 116 is formed, cladding layers 118 are formed over the top surfaces and the sidewalls of the fin structures 104b and 104c over the isolation structure 116, in accordance with some embodiments. In some embodiments, the cladding layers 118 are made of semiconductor materials. In some embodiments, the cladding layers 118 are made of silicon germanium (SiGe). In some embodiments, the cladding layers 118 and the first semiconductor layers 106 are made of the same semiconductor material.

The cladding layer 118 may be formed by performing an epitaxy process, such as VPE and/or UHV CVD, molecular beam epitaxy, other applicable epitaxial growth processes, or combinations thereof. After the cladding layers 118 are deposited, an etching process may be performed to remove the portion of the cladding layer 118 not formed on the sidewalls of the fin structures 104b and 104c, for example, using a plasma dry etching process. In some embodiments, the portions of the cladding layers 118 formed on the top surface of the fin structures 104b and 104c are partially or completely removed by the etching process, such that the thickness of the cladding layer 118 over the top surface of the fin structures 104b and 104c is thinner than the thickness of the cladding layer 118 on the sidewalls of the fin structures 104b and 104c.

Before the cladding layers 118 are formed, a semiconductor liner (not shown) may be formed over the fin structures 104b and 104c. The semiconductor liner may be a Si layer and may be incorporated into the cladding layers 118 during the epitaxial growth process for forming the cladding layers 118.

Next, as shown in FIG. 2E, a liner layer 120 is formed over the cladding layers 118 and the isolation structure 116, in accordance with some embodiments. In some embodiments, the liner layer 120 is made of a low k dielectric material having a k value lower than 7. In some embodiments, the liner layer 120 is made of SiN, SiCN, SiOCN, SiON, or the like. The liner layer 120 may be deposited using CVD, PVD, ALD, HDPCVD, MOCVD, RPCVD, PECVD, LPCVD, ALCVD, APCVD, other applicable methods, or combinations thereof. In some embodiments, the liner layer 120 has a thickness in a range from about 2 nm to about 8 nm.

After the liner layer 120 is formed, as shown in FIG. 2F, a filling layer 122 is formed over the liner layer 120 to completely fill the spaces between the adjacent fin structures 104b and 104c, and a polishing process is performed until the top surfaces of the cladding layers 118 are exposed, in accordance with some embodiments.

The liner layer 120 and the filling layer 122 are made of different materials. The dielectric constant of the liner layer 120 is higher than the dielectric constant of the filling layer 122. In some embodiments, the liner layer 120 is not made of oxide, such as SiN, SiCN or the like. In some embodiments, the filling layer 122 is made of oxide. In some embodiments, the filling layer 122 is made of $SiO_2$, SiOCN, SiON, or the like. The filling layer 122 may be deposited using a flowable CVD (FCVD) process that includes, for example, depositing a flowable material (such as a liquid compound) and converting the flowable material to a solid material by a suitable technique, such as thermal annealing and/or ultraviolet radiation treating.

Next, as shown in FIG. 2G, recesses 123 are formed between the fin structures 104a and 104b, in accordance with some embodiments. In some embodiments, the filling layer 122 and the liner layer 120 are recessed by performing an etching process. In some embodiments, the filling layer 122 are formed using a flowable CVD process, so that the resulting filling layer 122 can have a relatively flat top surface after the etching process is performed.

Afterwards, as shown in FIG. 2H, an etching stop layer 124 is formed in the recess 123, and a cap layer 126 is formed over the etching stop layer 124, in accordance with some embodiments. The etching stop layer 124 is conformally formed over the cladding layer 118, the liner layer 120 and the filling layer 122. The etching stop layer 124 and the cap layers 126 are used to protect the underlying layers from damage during the subsequent etching processes.

In some embodiments, the etching stop layer 124 is made of nitride, such as SiOCN, SiN, SiCN or another applicable material. In some embodiments, the etching stop layer 124 has a dielectric constant in a range from about 4 to about 7. In some embodiments, the etching stop layer 124 is formed by performing ALD, CVD, PVD, oxidation-based deposition process, other suitable process, or combinations thereof.

In some embodiments, the cap layer 126 is made of a high k dielectric material, such as $HfO_2$, $ZrO_2$, $HfAlO_x$, $HfSiO_x$, $Al_2O_3$, or the like. In some embodiments, the cap layer 126 has a dielectric constant in a range from about 20 to about 25. The dielectric constant of the top portion (e.g. the cap layer 126) is higher than the dielectric constant of the bottom portion (e.g. the liner layer 120 and the filling layer 122).

The dielectric materials for forming the cap layer 126 may be formed by performing ALD, CVD, PVD, oxidation-based deposition process, other suitable process, or combinations thereof.

Afterwards, as shown in FIG. 2I, a portion of the etching stop layer 124 and a portion of the cap layer 126 are removed to form first dummy fin structure 134a, the second dummy fin structure 134b and the third dummy fin structure 134c, in accordance with some embodiments. As a result, the top surface of the etching stop layer 124, the top surface of the cap layer 126 and the top surface of the nitride layer 114 are at the same level. In some embodiments, the portion of the etching stop layer 124 and the portion of the cap layer 126 are removed by a planarizing process, such as a chemical mechanical polishing (CMP) process. The CMP process is performed until the mask structures 110 are exposed.

Next, as shown in FIG. 2J, the mask structures 110 over the fin structures 104b and 104c and the top portions of the cladding layers 118 are removed to expose the top surfaces of the topmost second semiconductor material layers 108, in accordance with some embodiments. In some embodiments, the top surfaces of the cladding layers 118 are substantially level with the top surfaces of the topmost second semiconductor layers 108.

The mask structures 110 and the cladding layers 118 may be recessed by performing one or more etching processes that have higher etching rate to the mask structures 110 and the cladding layers 118 than the first dummy fin structure 134a, the second dummy fin structure 134b, and the third dummy fin structure 134c, such that the first dummy fin structure 134a, the second dummy fin structure 134b, and the third dummy fin structure 134c are only slightly etched during the etching processes. The selective etching processes can be dry etching, wet drying, reactive ion etching, or another applicable etching method.

Afterwards, as shown in FIG. 2K, sidewall portions of the etching stop layer 124 are removed to expose the sidewall of the cap layer 126, in accordance with some embodiments. Since the etching stop layer 124 and the cap layer 126 are made of different materials and have different etching selectivity, the etching stop layer 124 is removed but the cap layer 126 is remaining. The remaining etching stop layer 124 is directly below the cap layer 126. The top surface of the etching stop layer 124 is covered by the cap layer 126.

Afterwards, as shown in FIG. 2L, dummy gate structures 140 are formed across the fin structure 104b and 104c and the first dummy fin structures 134a, the second dummy fin structure 134b, and the third dummy fin structure 134c, in accordance with some embodiments. The dummy gate structures 140 may be used to define the source/drain regions and the channel regions of the resulting semiconductor structure 100a.

In some embodiments, the dummy gate structure 140 includes a dummy gate dielectric layer 136 and a dummy gate electrode layer 138. In some embodiments, the dummy gate dielectric layer 136 is made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layer 136 is formed using thermal oxidation, CVD, ALD, physical vapor deposition (PVD), another suitable method, or a combination thereof.

In some embodiments, the dummy gate electrode layer 138 is made of conductive material includes polycrystalline-silicon (poly-Si), poly-crystalline silicon-germanium (poly-SiGe), or a combination thereof. In some embodiments, the dummy gate electrode layer 138 is formed using CVD, PVD, or a combination thereof.

In some embodiments, hard mask layers 146 are formed over the dummy gate structures 140. In some embodiments, the hard mask layers 146 include multiple layers, such as an oxide layer 142 and a nitride layer 144. In some embodiments, the oxide layer 142 is silicon oxide, and the nitride layer 144 is silicon nitride.

The formation of the dummy gate structures 140 may include conformally forming a dielectric material as the dummy gate dielectric layers 136. Afterwards, a conductive material may be formed over the dielectric material as the dummy gate electrode layers 138, and the hard mask layer 146 may be formed over the conductive material. Next, the dielectric material and the conductive material may be patterned through the hard mask layer 146 to form the dummy gate structures 140.

In some embodiments, each of the first dummy fin structure 134a, the second dummy fin structure 134b and the third dummy fin structure 134c includes a bottom portion 134B, a top portion 134T and the etching stop layer 124 between the bottom portion 134B and the top portion 134T. The bottom portion 134B includes the liner layer 120 and the filling layer 122, and the top portion 134T includes the cap layer 126. The etching stop layer 124 and the cap layers 126 may be configured to protect the underlying layers from being damaged during the subsequent etching processes.

Since the first dummy fin structure 134a, the second dummy fin structure 134b and the third dummy fin structure 134c are self-aligned to the spaces between the fin structures 104b and 104c, complicated alignment processes are not required when forming the first dummy fin structure 134a, the second dummy fin structure 134b and the third dummy fin structure 134c.

In addition, the width of each of the first dummy fin structure 134a, the second dummy fin structure 134b and the third dummy fin structure 134c may be determined by the widths of the spaces between the fin structures 104b and 104c and the thicknesses of the cladding layer 118. In some embodiments, the first dummy fin structure 134a, the second dummy fin structure 134b and the third dummy fin structure 134c have substantially the same width. Meanwhile, in some embodiments, the spaces between the fin structures 104b and 104c have different widths, and the first dummy fin structure 134a, the second dummy fin structure 134b and the third dummy fin structure 134c also have different widths. As shown in FIG. 1, the first dummy fin structure 134a, the second dummy fin structure 134b and the third dummy fin structure 134c are formed between the fin structures 104b and 104c and are substantially parallel to the fin structures 104b and 104c in accordance with some embodiments.

Afterwards, as shown in FIG. 2M, after the dummy gate structures 136 are formed, gate spacers 148 are formed along and covering opposite sidewalls of the dummy gate structure 136, in accordance with some embodiments. In some embodiments, the gate spacers 148 also cover some portions of the top surfaces and the sidewalls of the first dummy fin structure 134a, the second dummy fin structure 134b and the third dummy fin structure 134c.

The gate spacers 148 may be configured to separate source/drain structures (formed afterwards) from the dummy gate structure 136. In some embodiments, the gate spacers 148 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

Afterwards, as shown in FIG. 2M, source/drain (S/D) recesses 150 are formed adjacent to the gate spacers 148, in accordance with some embodiments. More specifically, the fin structures 104b and 104c and the cladding layers 118 not covered by the dummy gate structures 140 and the gate spacers 148 are recessed. In addition, in some embodiments, the top portions 134T of the first dummy fin structure 134a, the second dummy fin structure 134b and the third dummy fin structure 134c are also recessed to have recessed portions 134T_R at the source/drain (S/D) regions in accordance with some embodiments. In some other embodiments, the cap layers 126 are completely removed.

In some embodiments, the fin structures 104b and 104c and the cladding layers 118 are recessed by performing an etching process. The etching process may be an anisotropic etching process, such as dry plasma etching, and the dummy gate structure 136 and the gate spacers 148 may be used as etching masks during the etching process.

After the source/drain recesses 142 are formed, as shown in FIG. 2N, the first semiconductor material layers 106 and the cladding layers 118 exposed by the S/D recesses 150 are laterally recessed to form notches 153, in accordance with some embodiments.

In some embodiments, an etching process is performed to laterally recess the first semiconductor material layers 106 of the fin structure 104a, 104b, and 104c and the cladding layers 118 from the S/D recesses 150. In some embodiments, during the etching process, the first semiconductor material layers 106 and the cladding layers 118 have a greater etching rate (or etching amount) than the second semiconductor material layers 108, thereby forming notches 153 between the adjacent second semiconductor material layers 108 and around the second semiconductor material layers 108. In some embodiments, the etching process is an isotropic etching such as dry chemical etching, remote plasma etching, wet chemical etching, another suitable technique, and/or a combination thereof.

Next, as shown in FIG. 2O, inner spacers 156 are formed in the notches 153 between and around the second semiconductor material layers 108, in accordance with some embodiments. The top surface of the first etching stop layer 124 is higher than the topmost surface of the inner spacer 156.

The inner spacers 156 may be configured to separate the source/drain structures and the gate structures formed in subsequent manufacturing processes. In some embodiments, the inner spacers 156 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

Next, as shown in FIG. 2P, source/drain (S/D) structures 158 are formed in the source/drain recesses 142, in accordance with some embodiments. In some embodiments, the source/drain (S/D) structures 158 are separated by the dummy fin structures 134a, 134b, and 134c. More specifically, the source/drain structures 158 are formed in the spaces the first dummy fin structure 134a, the second dummy fin structure 134b and the third dummy fin structure 134c at the source/drain region. In addition, the S/D structures 158 are in direct contact with the dielectric liner 120 at the bottom portion of the first dummy fin structure 134a, the second dummy fin structure 134b and the third dummy fin structure 134c in accordance with some embodiments. In some embodiments, air gaps are formed under the S/D structures 158. In some embodiments, the air gaps are encircled by the S/D structures 158, the first dummy fin structure 134a, the second dummy fin structure 134b and the third dummy fin structure 134c and the isolation structure 116. In some embodiments, the top surfaces of the etching stop layer 124 of the dummy fin structures 134a, 134b, and 134c is higher than the top surfaces of the S/D structures 158.

In some embodiments, the S/D structures 158 are formed using an epitaxial growth process, such as MBE, MOCVD, VPE, other applicable epitaxial growth process, or a combination thereof. In some embodiments, the S/D structures 158 are made of any applicable material, such as Ge, Si, GaAs, AlGaAs, SiGe, GaAsP, SiP, SiC, SiCP, or a combination thereof.

In some embodiments, the S/D structures 158 are in-situ doped during the epitaxial growth process. For example, the S/D structures 158 may be the epitaxially grown SiGe doped with boron (B). For example, the S/D structures 158 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the S/D structures 158 are doped in one or more implantation processes after the epitaxial growth process.

Afterwards, as shown in FIG. 2Q, a contact etch stop layer (CESL) 160 is formed over the S/D structure 158, and an inter-layer dielectric (ILD) layer 162 is formed over the CESL 170, in accordance with some embodiments. Next, a portion of the ILD layer 162 is removed to expose the top surface of the dummy gate electrode layer 138. The CESL 160 is in direct contact with the etching stop layer 124. In some embodiments, the portion of the ILD layer 162 is removed by a planarizing process, such as a chemical mechanical polishing (CMP) process.

After the CESL 160 and the ILD layer 162 are deposited, protection layers 164 are formed over the interlayer dielectric layer 152. More specifically, after the planarization process is performed, the ILD layer 162 is recessed to a level below the top surface of the dummy gate electrode layer 138 and the protection layers 164 are deposited over the ILD layer 162 to protect the ILD layer 162 from subsequent etching processes.

In some embodiments, the protection layers 164 are made of a material that is the same as or similar to that in the CESL 160. In some embodiments, the protection layers 164 are made of $Si_3N_4$, SiCN, SiOCN, SiOC, a metal oxide such as $HrO_2$, $ZrO_2$, hafnium aluminum oxide, and hafnium silicate, or another applicable material. The protection layers 164 may be formed by CVD, PVD, ALD, or another applicable method.

FIGS. 2R to 2U illustrate diagrammatic perspective views of intermediate stages of manufacturing the semiconductor structure 100 shown in the dotted line block $C_2$ of FIG. 1 in accordance with some embodiments. Although some elements shown in FIG. 1 are not shown in FIGS. 2R to 2U, they may have similar features as the elements shown in FIGS. 2R to 2U. For example, the dummy fin structure 134c may have the same shapes as the dummy fin structure 134b shown in FIGS. 2R to 2S.

As shown in FIG. 2R, a portion of the dummy gate electrode layer 138 is removed to expose the first dummy fin structure 134a and the second dummy fin structure 134b, in accordance with some embodiments. As a result, the top surface of the first dummy fin structure 134a and the top surface of the second dummy fin structure 134b is higher than the top surface of the dummy gate electrode layer 138. In addition, the topmost surface of the dummy gate dielectric layer 136 is higher than the topmost surface of the dummy gate electrode layer 138.

As shown in FIG. 2S, a portion of the second dummy fin structure 134b is removed, but the first dummy fin structure 134a is not removed, in accordance with some embodiments. A photoresist layer (not shown) is formed over the first dummy fin structure 134a to protect the first dummy fin structure 134a, and the portion of the second dummy fin structure 134b is removed. More specifically, a portion of the cap layer 126 of the second dummy fin structure 134b is removed. As a result, the top surface of the first dummy fin structure 134a is higher than the top surface of the second dummy fin structure 134b.

It should be noted that the etching stop layer 124 is used to protect the underlying layers when the portion of cap layer 126 of the second dummy fin structure 134b is removed. If no etching stop layer 124 is below the cap layer 126, the liner layer 120 and the filling layer 122 below the cap layer 126 may be damaged or exposed when the etching process is performed on the top portion of the second dummy fin structure 134b. In addition, the etching stop layer 124 can enlarge the etching window.

It should be noted that the cap layer 126 and the etching stop layer 124 are made of different materials and have different etching selectivity. The term of "selectivity" or "etching selectivity" is defined as the ratio of etching rate of one material (the reference material) relative to another material (the material of interest). An increase in etch selectivity means that the selected material, or material of interest, is harder to etch. A decrease in etch selectivity means that the selected material is easier to etch. The etching selectivity of the etching stop layer 124 with respect to the cap layer 126 is high, and therefore the cap layer 126 is removed by the etching process while the etching stop layer 124 is not removed. Since the etching selectivity of the etching stop layer 124 with respect to the cap layer 126 is improved, the height of the first dummy fin structure 134a at different regions (at central region or at side region of the substrate 102) are well controlled and the uniformity of the first dummy fin structure 134a is also improved.

Next, as shown in FIG. 2T, the dummy gate structures 128, the cladding layers 118, and the first semiconductor material layers 106 are removed to form gate trenches (not shown), and gate structures 172 are formed in the gate trenches, in accordance with some embodiments.

More specifically, the dummy gate structures 128, the cladding layers 118, and the first semiconductor material layers 106 are removed are removed to form nanostructures 108' with the second semiconductor material layers 108. The removal process may include one or more etching processes. For example, when the dummy gate electrode layers 138 are polysilicon, a wet etchant such as a tetramethylammonium hydroxide (TMAH) solution may be used to selectively remove the dummy gate electrode layers 138. Afterwards, the dummy gate dielectric layers 136 may be removed using a plasma dry etching, a dry chemical etching, and/or a wet etching. The first semiconductor material layers 106 and the cladding layers 118 may be removed by performing a selective wet etching process, such as APM (e.g., ammonia hydroxide-hydrogen peroxide-water mixture) etching process. For example, the wet etching process uses etchants such as ammonium hydroxide (NH$_4$OH), TMAH, ethylenediamine pyrocatechol (EDP), and/or potassium hydroxide (KOH) solutions.

In some embodiments, the upper portions of the gate spacers 148 are also removed, so that the upper portions of the gate trenches may be enlarged and the gate structure 172 can be formed in the gate trenches more easily. In some embodiments, the height of the gate spacers is in a range from about 5 nm to about 50 nm.

After the nanostructures 108' are formed, the gate structures 172 are formed wrapping around the nanostructures 108'. The gate structures 172 wrap around the nanostructures 108' to form gate-all-around transistor structures, in accordance with some embodiments. The top surface of the etching stop layer 124 is higher than the topmost nanostructure 108'.

In some embodiments, the gate structures 172 include an interfacial layer 166, a gate dielectric layer 168, and a gate electrode layer 170. In some embodiments, the interfacial layers 166 are oxide layers formed around the nanostructures 108' and on the exposed portions of the base fin structures 105. The interfacial layers 166 is in direct contact with the etching stop layer 124. In some embodiments, the interfacial layers 166 are formed by performing a thermal process.

In some embodiments, the gate dielectric layers 168 are formed over the interfacial layers 166, so that the nanostructures 108' are surrounded (e.g. wrapped) by the gate dielectric layers 168. In addition, the gate dielectric layers 168 also cover the sidewalls of the gate spacers 148, the inner spacers 156, and the dummy fin structures 124a, 124b, and 124c.

In some embodiments, the gate dielectric layers 168 are made of one or more layers of dielectric materials, such as HfO$_2$, HfSiO, HfSiON, HfTaO, HfTiO, HfZrO, zirconium oxide, aluminum oxide, titanium oxide, hafnium dioxide-alumina (HfO$_2$—Al2O$_3$) alloy, other applicable high-k dielectric materials, or a combination thereof. In some embodiments, the gate dielectric layers 168 are formed using CVD, ALD, other applicable methods, or a combination thereof.

In some embodiments, the gate electrode layers 170 are formed on the gate dielectric layers 168. In some embodiments, the gate electrode layers 170 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 170 are formed using CVD, ALD, electroplating, another applicable method, or a combination thereof. Other conductive layers, such as work function metal layers, may also be formed in the gate structures 172, although they are not shown in the figures. After the interfacial layers 166, the gate dielectric layers 168, and the gate electrode layers 170 are formed, a planarization process such as CMP or an etch-back process may be performed until the protection layers 164 are exposed.

After the gate structures 172 are formed, as shown in FIG. 2U, an etch back process is performed to remove the upper portions of the gate structures 172, in accordance with some embodiments. More specifically, the upper portions of the gate structures 156 are removed to form recesses (not shown) between the gate spacers 148.

The etching process for removing the upper portions of the gate structures 172 is also called as "self-aligned cut metal gate etching process". Note that the first dummy fin structure 134a is not removed when the self-aligned cut metal gate etching process is performed. The first dummy fin structure 134a is used as a block layer or a separation layer to divide the gate structure 172 into a first gate structure 172a and the second gate structure 172b. Therefore, the first dummy fin structure 134a is between the first gate structure 172a and the second gate structure 172b. The first dummy fin structure 134a is higher than the topmost surface of the gate electrode layer 170 of the first gate structure 172a. The first gate structure 172a is separated from the second gate structure 172b by the first dummy fin structure 134a.

In addition, when the self-aligned cut metal gate etching process is performed, the etching stop layer 124 plays a role to block or stop the etching process if the cap layer 126 is completely removed. Therefore, the etching process window is enlarged due to the formation of the etching stop layer 124.

Furthermore, the second dummy fin structure 134b is lower than the topmost surface of the gate electrode layer 170 of the second gate structure 172b. The second gate structure 172b is a continuous layer which is over the second dummy fin structure 134b. The top surface of the first dummy fin structure 134a is higher than the top surface of the second dummy fin structure 134b. In addition, the height of the first dummy fin structure 134a is greater than the height of the second dummy fin structure 134b. Note that the isolation structure 116 has a width which is greater than the width of the first dummy fin structure 134a.

Next, a dielectric layer 180 is formed over the first dummy fin structure 134a, the second dummy fin structure 134b, the first gate structure 172a of the gate structure 172 and the second gate structure 172b of the gate structure 172.

The dielectric layer 180 may include multilayers made of multiple dielectric materials, such as Al$_2$O$_3$, ZrO$_2$, silicon oxide, silicon nitride, silicon oxynitride, phosphosilicate glass (PSG), borophosphosilicate glass (BPSG), or another applicable dielectric materials. The dielectric layer 180 may be formed by chemical vapor deposition (CVD), physical vapor deposition, (PVD), atomic layer deposition (ALD), or another applicable processes.

FIG. 3A-3E show cross-sectional representations of various stages of forming the semiconductor device structure 100a in a region A shown in FIG. 2G-2K, in accordance with some embodiments of the disclosure.

Figure 3A:
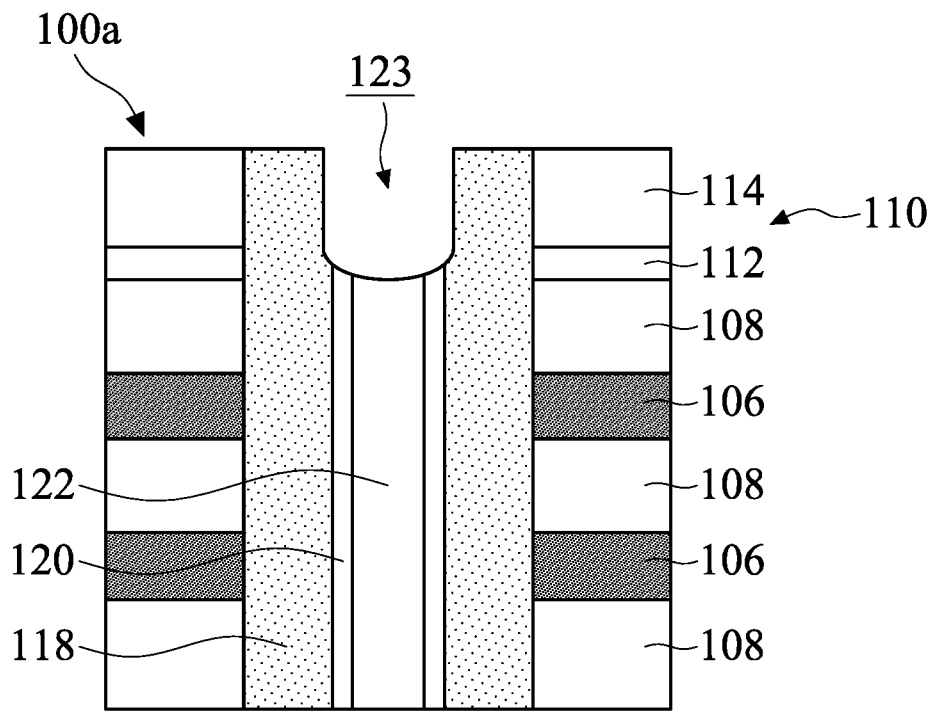
FIG. 3A-3E show cross-sectional representations of various stages of forming the semiconductor device structure in a region A shown in FIG. 2G-2K, in accordance with some embodiments of the disclosure.

As shown in FIG. 3A, the filling layer 122 and the liner layer 120 are recessed to form recess 123. In addition, a portion of the cladding layer 118 is removed. Note that the bottom surface of the recess 123 is recessed. In some embodiments, the recess 123 has a concave bottom surface.

Figure 3B:
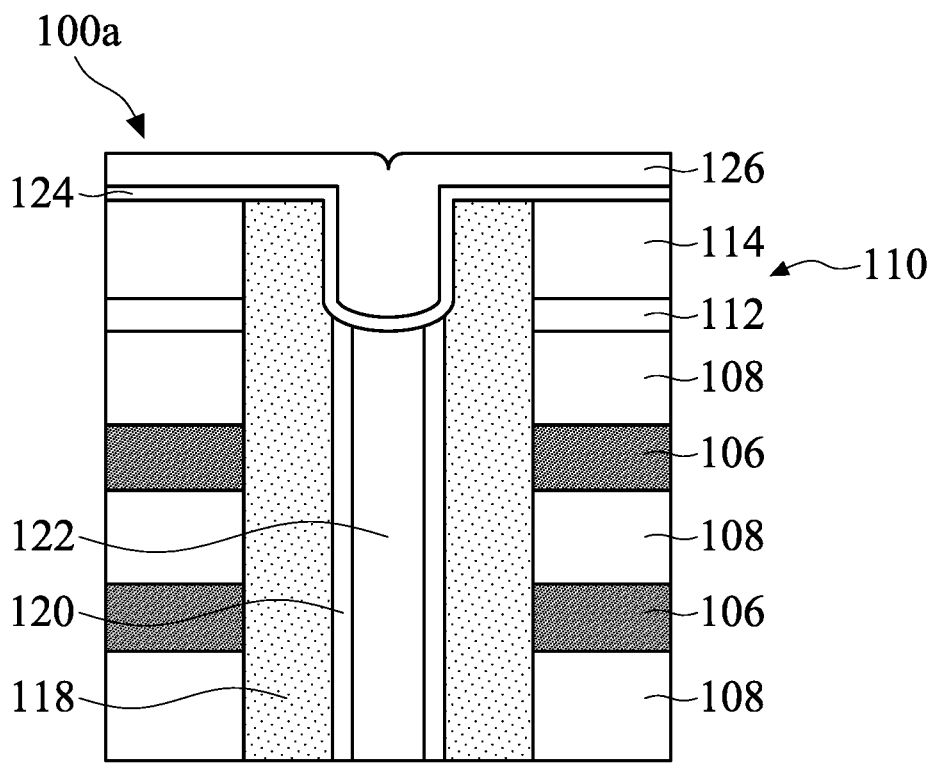

Next, as shown in FIG. 3B, the etching stop layer 124 and the cap layer 126 are sequentially formed in the recess 123, in accordance with some embodiments of the disclosure. More specifically, the outer sidewall of the etching stop layer 124 is not aligned with the outer sidewall of the liner layer 120. The outer sidewall of the etching stop layer 124 extends beyond the outer sidewall of the liner layer 120.

Figure 3C:
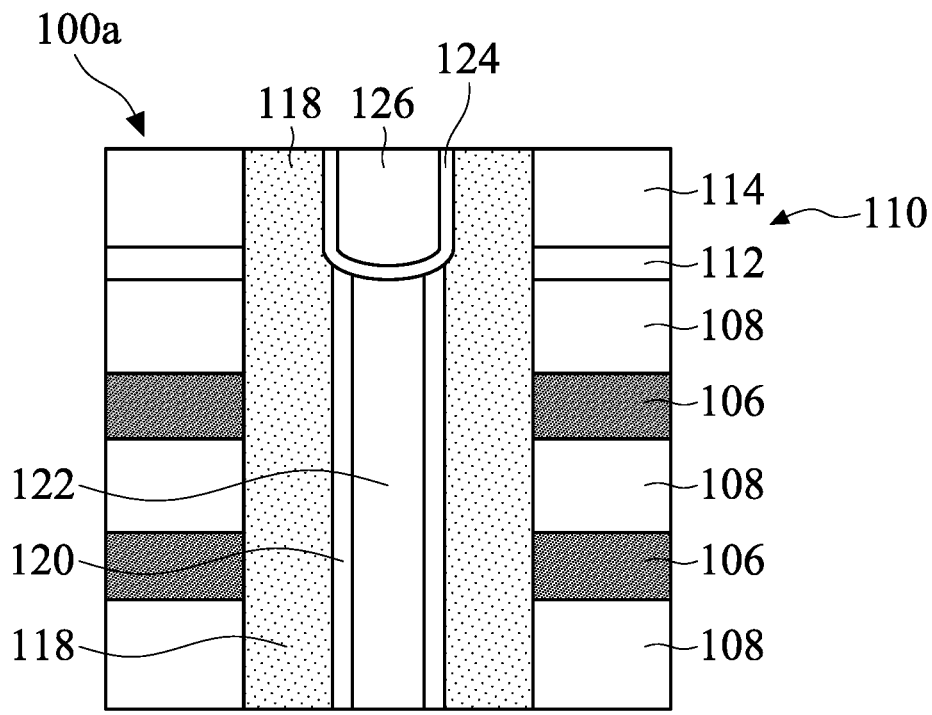

Afterwards, as shown in FIG. 3C, a portion of the cap layer 126 and a portion of the etching stop layer 124 are removed, in accordance with some embodiments of the disclosure. The portion of the cap layer 126 and the portion of the etching stop layer 124 are removed by a planarizing process, such as a chemical mechanical polishing (CMP) process. As a result, the top surface of the cap layer 126, the top surface of the etching stop layer 124 and the top surface of the cladding layer 118 are at the same level.

Figure 3D:
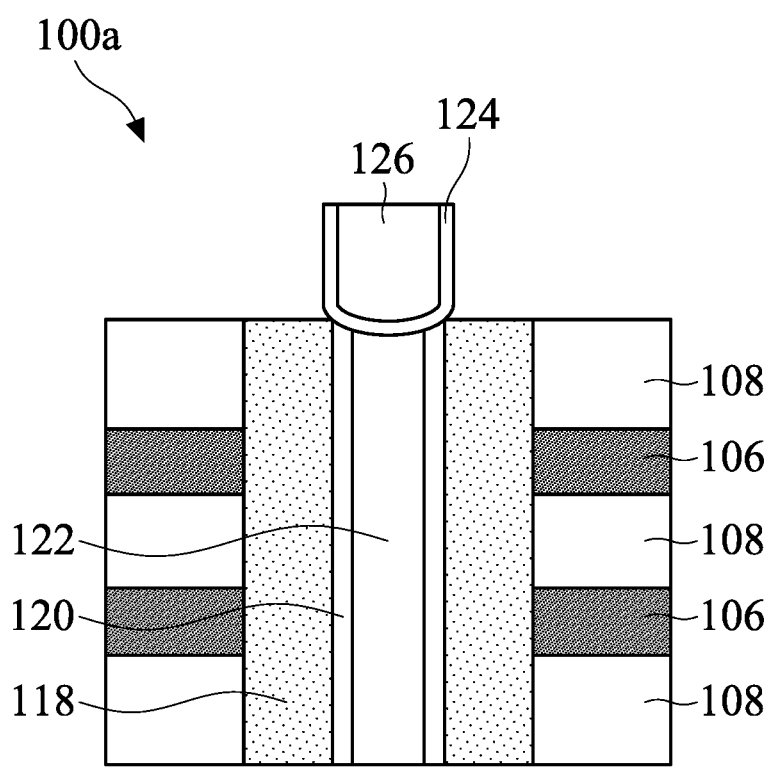

Next, as shown in FIG. 3D, the mask structures 110 and the top portions of the cladding layers 118 are removed by an etching process, in accordance with some embodiments of the disclosure. As a result, the sidewall portions of the etching stop layer 124 are exposed. The etching stop layer 124 has a U-shaped structure, and the cap layer 126 is in the recessed portion of the U-shaped structure. The top surface of the cap layer 126 is substantially level with the top surface of the etching stop layer 124.

The etching process may be a multiple etching process. In some embodiments, the etching process is a wet etching process, and the etching solution includes ammonia (NH4OH) and hydrogen peroxide ($H_2O_2$) mixture.

Figure 3E:
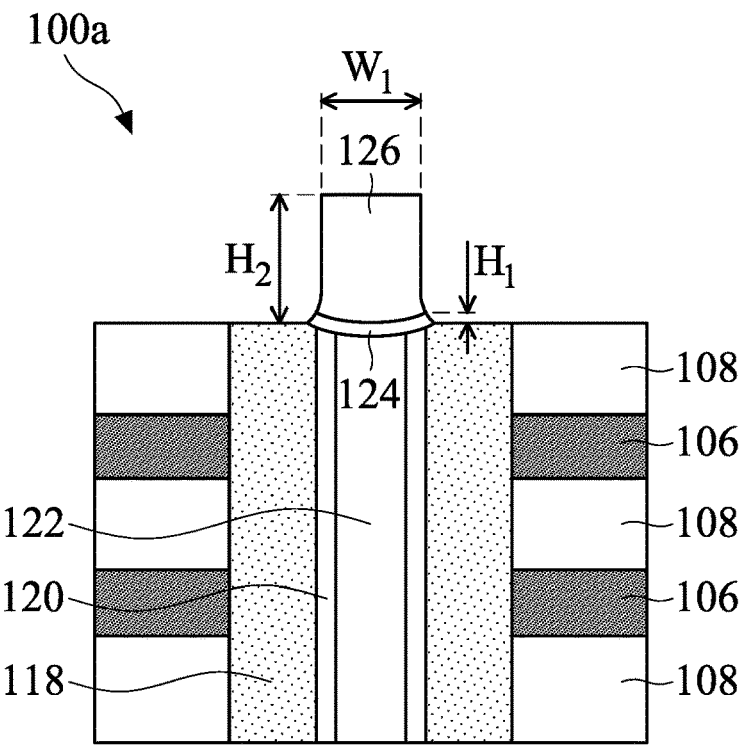
Figure 3E:
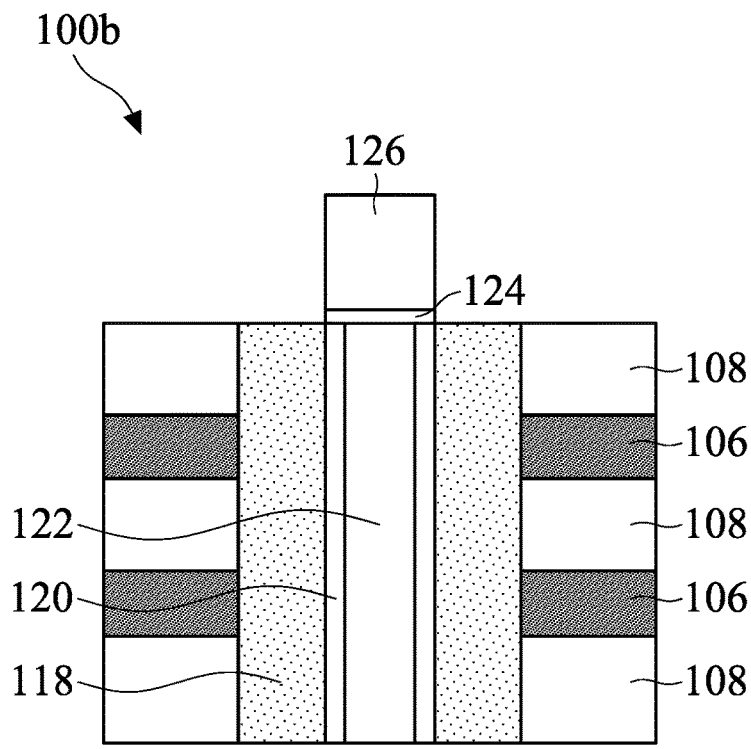

Next, as shown in FIG. 3E, sidewall portions of the etching stop layer 124 are removed to expose the sidewalls of the cap layer 126, in accordance with some embodiments of the disclosure. As a result, the top surface of the cap layer 126 is higher than the top surface of the etching stop layer 124. The etching stop layer 124 has a curved structure. More specifically, the etching stop layer 124 has a recessed bottom surface and a recessed top surface. The etching stop layer 124 is between the top portion (e.g. the cap layer 126) and the bottom portion (e.g. the liner layer 120, the filling layer 122) of the dummy fin structure 134a, 134b to protect the bottom portion.

More specifically, the sidewall portions of the etching stop layer 124 are removed by an etching process. In some embodiments, the etching process includes a wet etching process, and the etching solution includes hydrofluoric acid (HF) and phosphoric acid ($H_3PO_4$).

The etching stop layer 124 has a first height $H_1$ along a vertical direction which is measured from the top surface of the cladding layer 118 to the top surface of the etching stop layer 124. The etching stop layer 124 has a first width $W_1$ along a horizontal direction. In some embodiments, the first width $W_1$ in a range of about 5 nm to about 20 nm. There is a second height $H_2$ along a vertical direction which is measured from the top surface of the cladding layer 118 to the top surface of the cap layer 126. In some embodiments, the first height $H_1$ in a range of about 2 nm to about 5 nm. In some embodiments, the cap layer 126 has an aspect ratio in a range from about 1 to about 3. In some embodiments, a ratio ($H_1/H_2$) of the first height to the second height is in a range from about 0.1% to about 30%. If the ratio is smaller than 0.1%, the etching stop layer 124 is too small to have enough protection effect. If the ratio is greater than 30%, the cap layer 126 is not thick enough to use as a block layer between two adjacent gate structures 172.

FIG. 3E' shows a cross-sectional representation of a semiconductor device structure 100b, in accordance with some embodiments of the disclosure. The semiconductor structure 100b of FIG. 3E' is similar to, or the same as, the semiconductor structure 100a of FIG. 3A, the difference is that the etching stop layer 124 has a planar bottom surface and a planar top surface. The bottom surface of the etching stop layer 124 is substantially coplanar with the top surface of the second semiconductor layer 108.

Figure 4A:
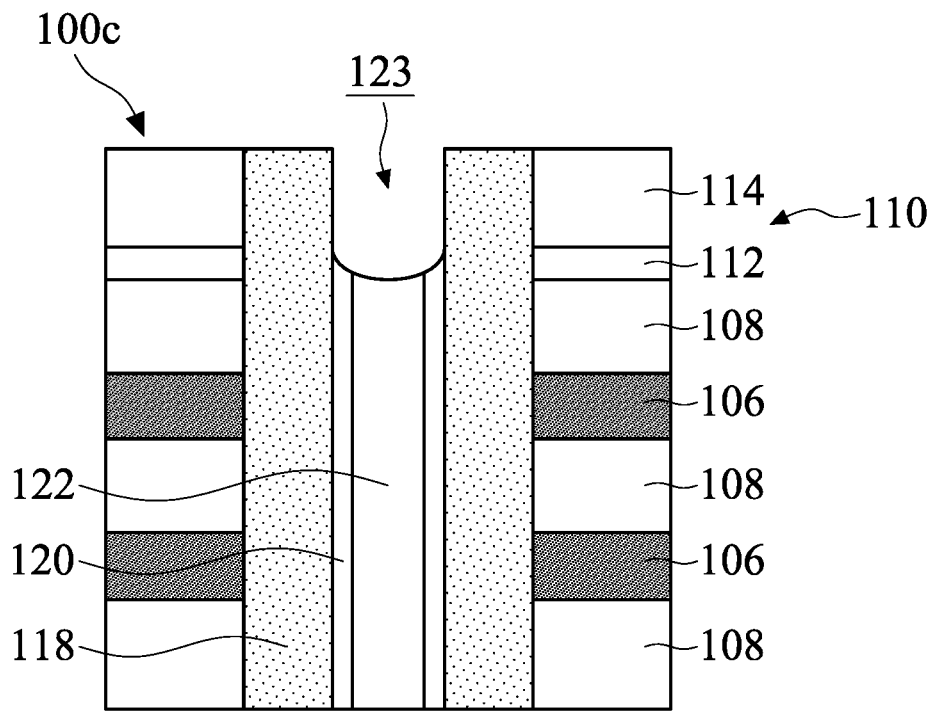
FIGS. 4A-4H show cross-sectional representations of various stages of forming a semiconductor device structure, in accordance with some embodiments of the disclosure.

FIGS. 4A-4H show cross-sectional representations of various stages of forming a semiconductor device structure 100c, in accordance with some embodiments of the disclosure. The semiconductor structure 100c of FIG. 4A is similar to, or the same as, the semiconductor structure 100a of FIG. 3A, the difference is that a core layer 125 is surrounded by the etching stop layer 124 and the cap layer 126 in FIG. 4H.

As shown in FIG. 4A, the recess 123 is formed over the liner layer 120 and the filling layer 122. Note that the cladding layer 118 is not removed in FIG. 4A, but a portion of the cladding layer 118 is removed in FIG. 3A.

Figure 4B:
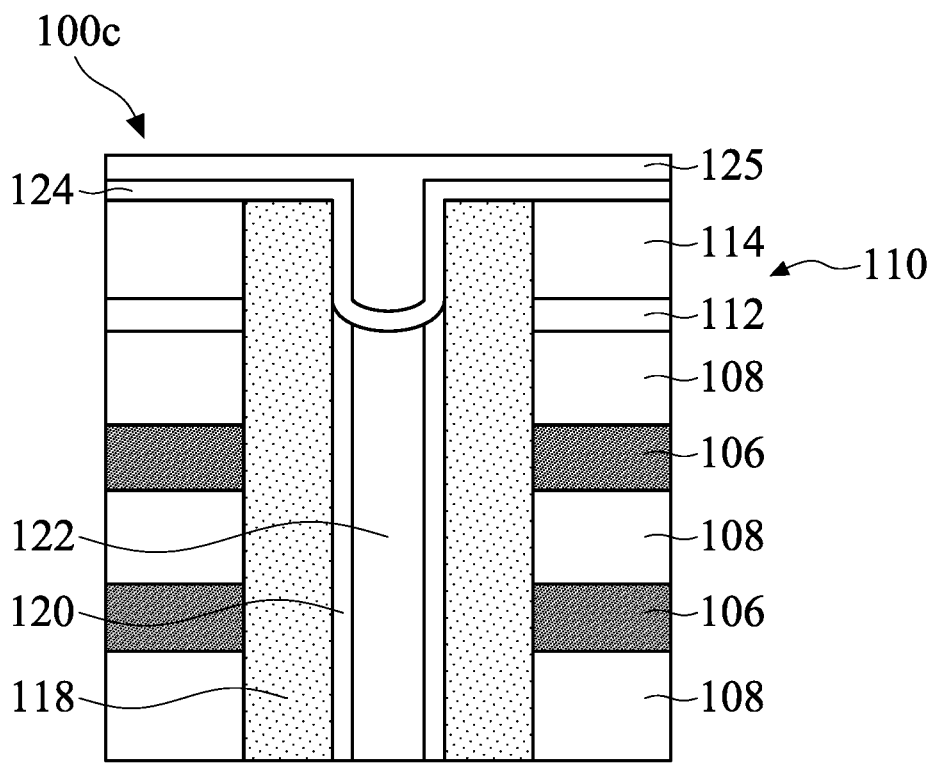

Next, as shown in FIG. 4B, the etching stop layer 124 and the core layer 125 are sequentially formed in the recess 123, in accordance with some embodiments of the disclosure.

The core layer 125 and the filling layer 122 may be made of the same material. The core layer 125 may be made of oxide. In some embodiments, the core layer 125 is made of SiO, SiN, SiCN, SiOCN, SiON, or the like. The core layer 120 may be deposited using a flowable CVD (FCVD) process that includes, for example, depositing a flowable material (such as a liquid compound) and converting the flowable material to a solid material by a suitable technique, such as thermal annealing and/or ultraviolet radiation treating.

Figure 4C:
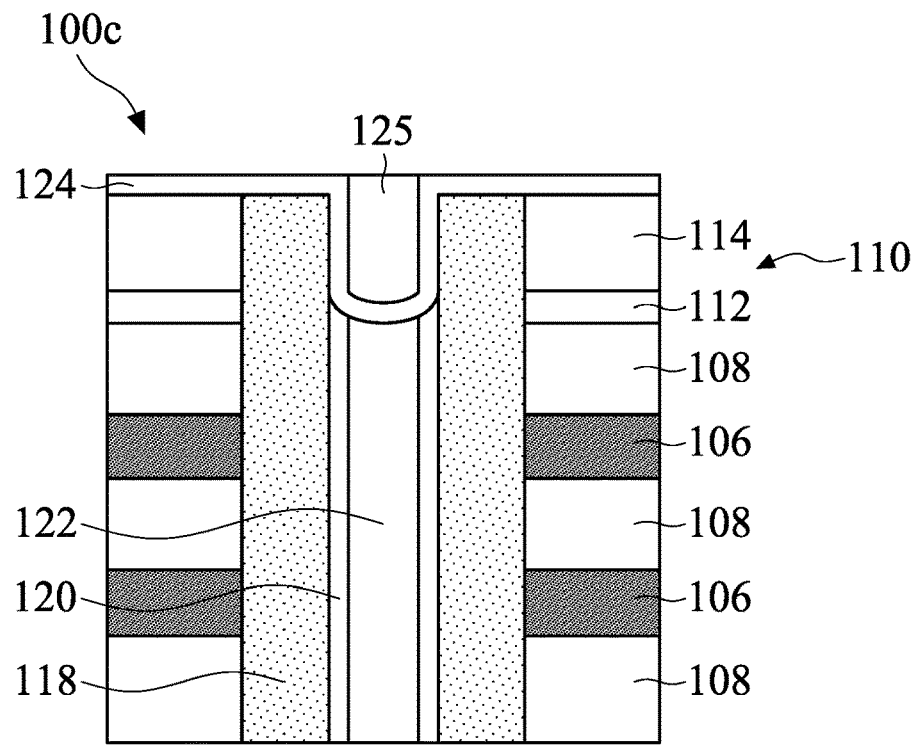

Next, as shown in FIG. 4C, a first portion of the core layer 125 is removed to expose the top surface of the etching stop layer 124, in accordance with some embodiments of the disclosure. The first portion of the core layer 125 is removed by a planarizing process, such as a chemical mechanical polishing (CMP) process.

Figure 4D:
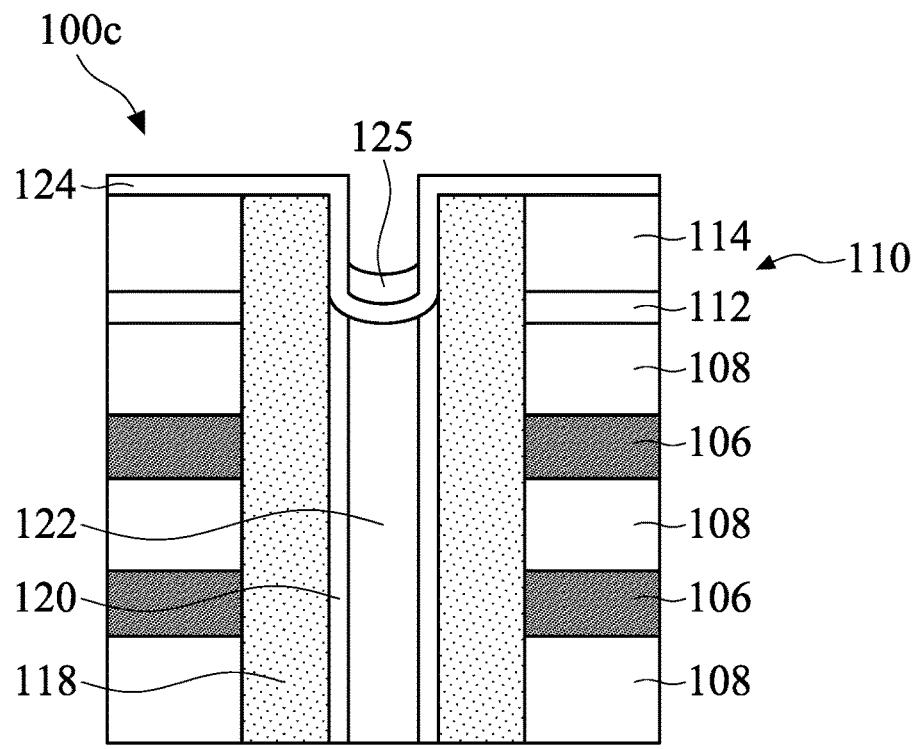

Afterwards, as shown in FIG. 4D, a second portion of the core layer 125 is removed, in accordance with some embodiments of the disclosure. As a result, the top surface of the remaining core layer 125 is lower than the top surface of the etching stop layer 124. In some embodiments, the remaining core layer 125 has a concave profile.

It should be noted that the core layer 125 and the etching stop layer 124 are made of different materials and have different etching selectivity. The etching selectivity of the etching stop layer 124 with respect to the core layer 125 is high, and therefore the core layer 125 is removed by the etching process while the etching stop layer 124 is not removed.

Figure 4E:
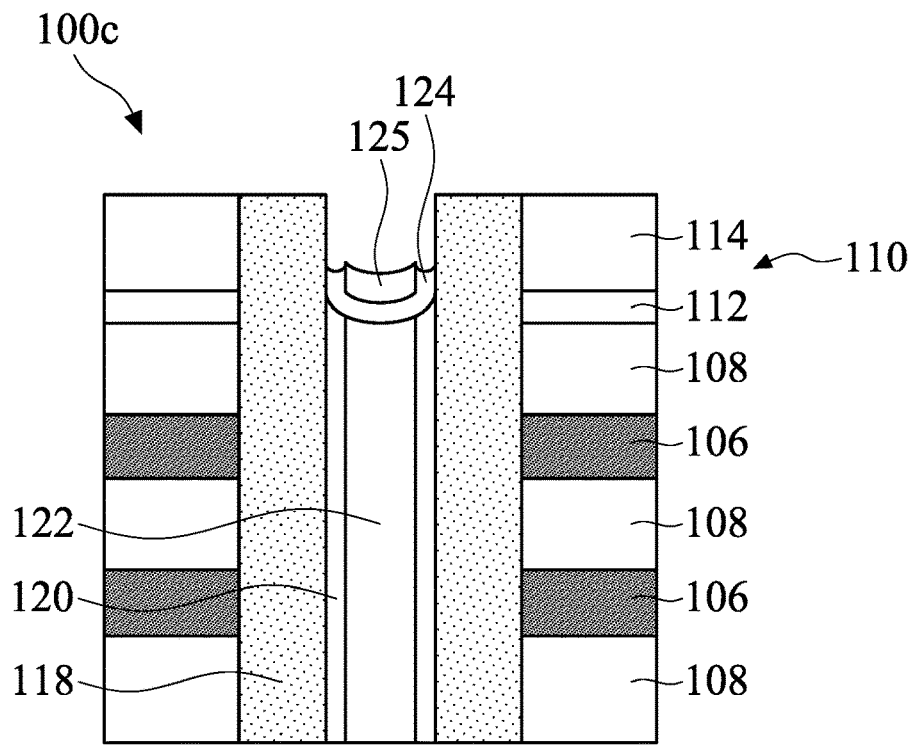

Next, as shown in FIG. 4E, a portion of the etching stop layer 124 is removed, in accordance with some embodiments of the disclosure. As a result, the top surface of the etching stop layer 124 is lower than the top surface of the cladding layer 118. The core layer 125 protrudes from the top surface of the etching stop layer 124. In other words, the topmost surface of the core layer 125 is higher than the topmost surface of the etching stop layer 124, but lower than the top surface of the cladding layer 118.

Figure 4F:
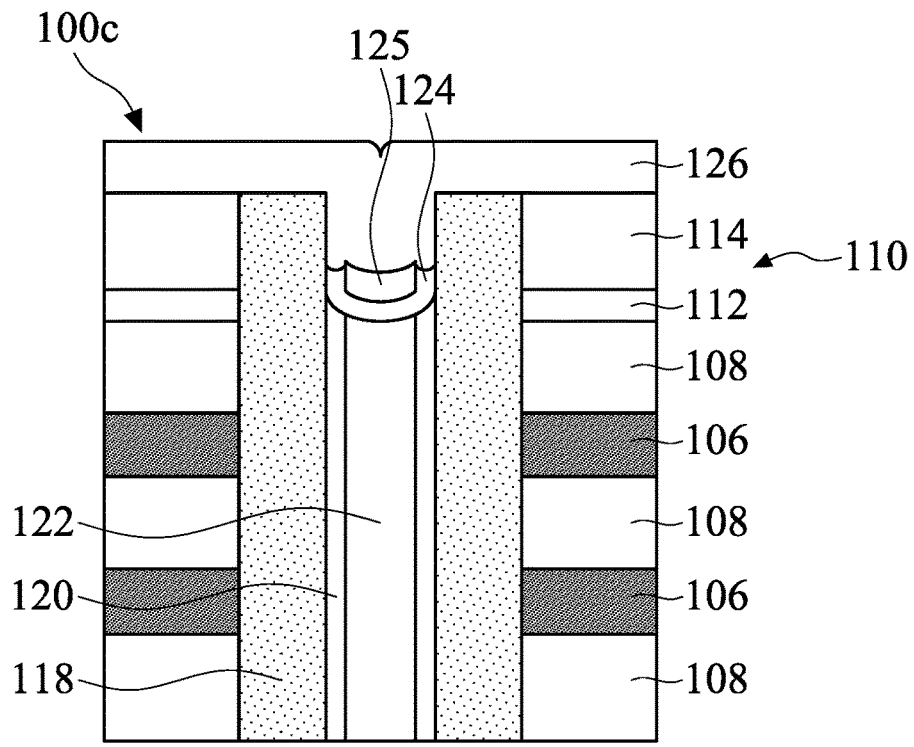

Afterwards, as shown in FIG. 4F, the cap layer 126 is formed over the core layer 125, the etching stop layer 124 and cladding layer 118, in accordance with some embodiments of the disclosure.

Figure 4G:
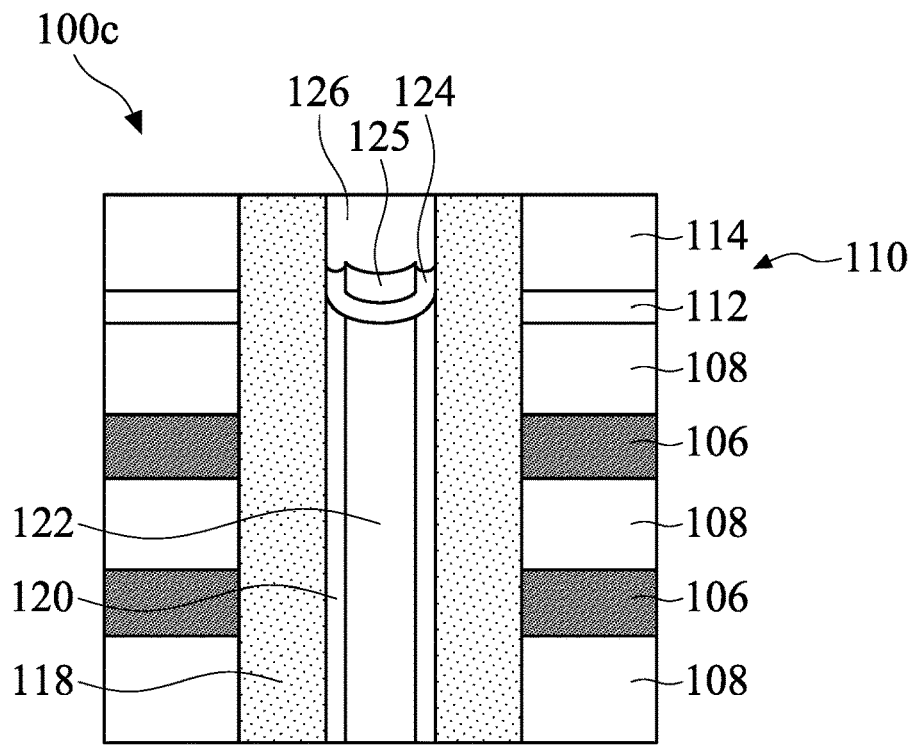

Next, as shown in FIG. 4G, a portion of the cap 126 is removed, in accordance with some embodiments of the disclosure. As a result, the top surface of the cap layer 126 is substantially coplanar with the top surface of the cladding layer 118. The core layer 125 is covered by the cap layer 126, and the etching stop layer 124 has a U-shaped structure. The core layer 125 is surrounded by the etching stop layer 124 and the cap layer 126 to form the core-shell structure. The portion of the cap layer 126 is removed by a planarizing process, such as a chemical mechanical polishing (CMP) process.

Figure 4H:
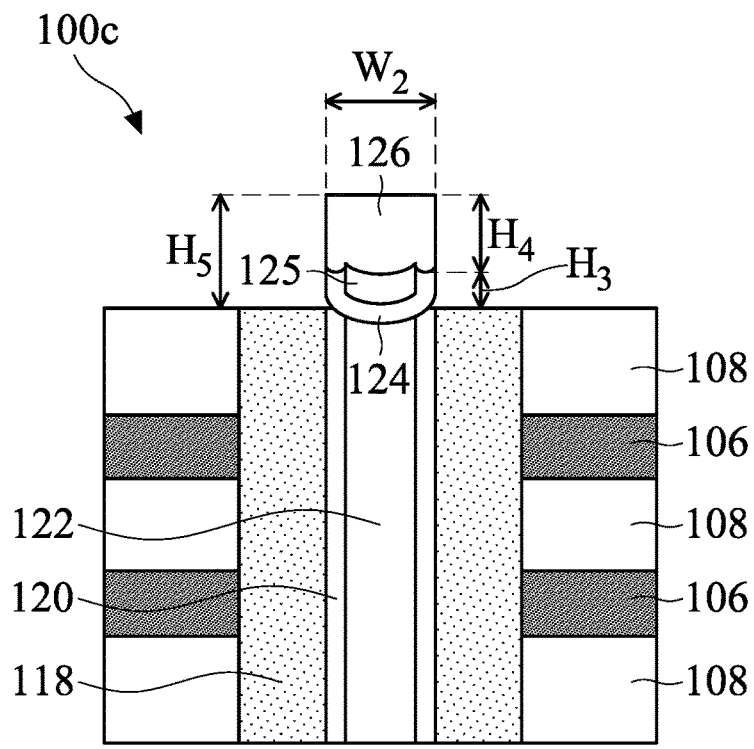

Afterwards, as shown in FIG. 4H, the mask structures 110 and the top portions of the cladding layers 118 are removed by an etching process, in accordance with some embodiments of the disclosure. As a result, the sidewall portions of the etching stop layer 124 and the cap layer 126 are exposed.

Since the cap layer 126 is made of high-k dielectric material and therefore a unwanted capacitor is formed when the cap layer 126 is sandwiched between two adjacent S/D structures 158. The core layer 125 and the etching stop layer 124 are formed to form the core shell structure to reduce the amount of the cap layer 126. Therefore, the unwanted capacitance (Ceff) between two adjacent S/D structures 158 is reduced due to the formation of the core shell structure.

The etching stop layer 124 has a third height $H_3$ along a vertical direction measured from the top surface of the cladding layer 118 to the top surface of the etching stop layer 124. The cap layer 126 has a fourth height $H_4$ along a vertical direction. The cap layer 126 has a second width $W_2$ along the horizontal direction. In some embodiments, the third height $H_3$ is in a range from about 5 nm to about 20 nm. In some embodiments, the fourth height $H_4$ is in a range from about 5 nm to about 20 nm. There is a fifth height $H_5$ along a vertical direction which is measured from the top surface of the cladding layer 118 to the top surface of the cap layer 126. In some embodiments, a ratio ($H_3/H_5$) of the third height $H_3$ to the fifth height $H_5$ is in a range from about 0.1% to about 30%. If the ration is smaller than 0.1%, the etching stop layer 124 is too small to have enough thickness to protect the underlying layers. If the ration is greater than 30%, the cap layer 126 is not thick enough to use as a block layer between two adjacent gate structures.

Figure 5:
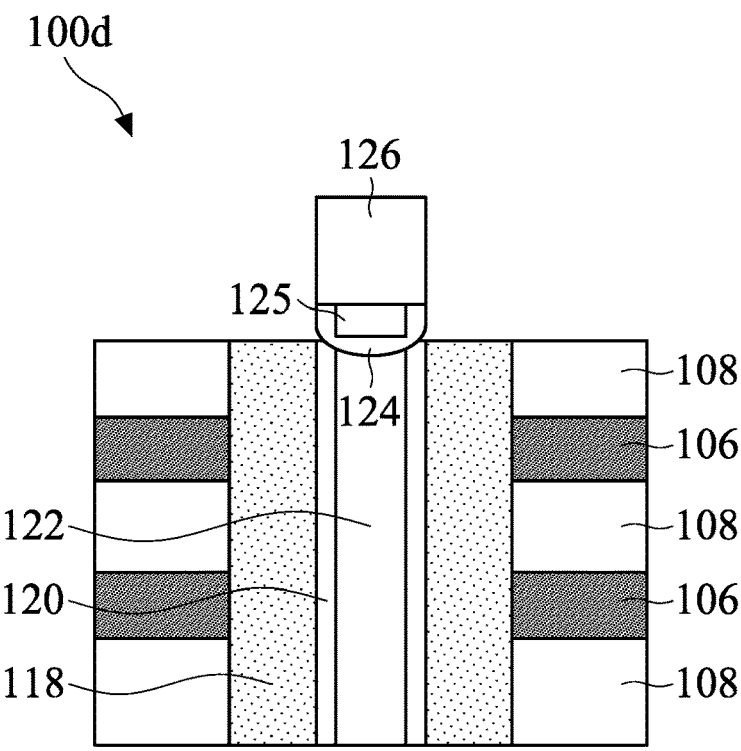
FIG. 5 shows a cross-sectional representation of a semiconductor device structure, in accordance with some embodiments of the disclosure.

FIG. 5 shows a cross-sectional representation of a semiconductor device structure 100d, in accordance with some embodiments of the disclosure. The semiconductor structure 100d of FIG. 5 is similar to, or the same as, the semiconductor structure 100c of FIG. 4H, the difference is that the core layer 125 does not protrude from the top surface of the etching stop layer 124. The top surface of the etching stop layer 124 is substantially coplanar with the top surface of the core layer 125.

Figure 6:
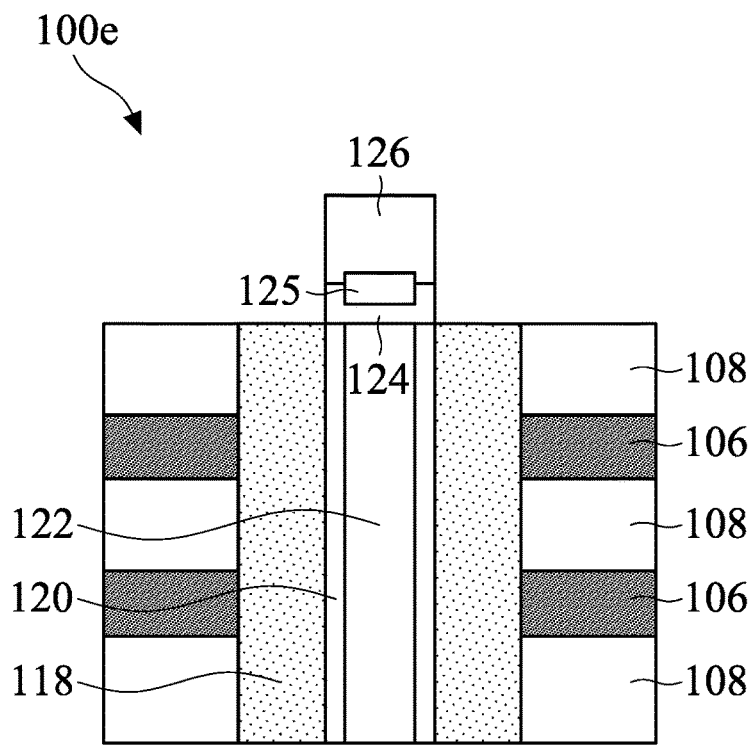
FIG. 6 shows a cross-sectional representation of a semiconductor device structure, in accordance with some embodiments of the disclosure.

FIG. 6 shows a cross-sectional representation of a semiconductor device structure 100e, in accordance with some embodiments of the disclosure. The semiconductor structure 100e of FIG. 6 is similar to, or the same as, the semiconductor structure 100c of FIG. 4H, the difference is that bottom surface of the etching stop layer 124 is planar. The top surface of the core layer 125 is higher than the top surface of the etching stop layer 124.

Figure 7:
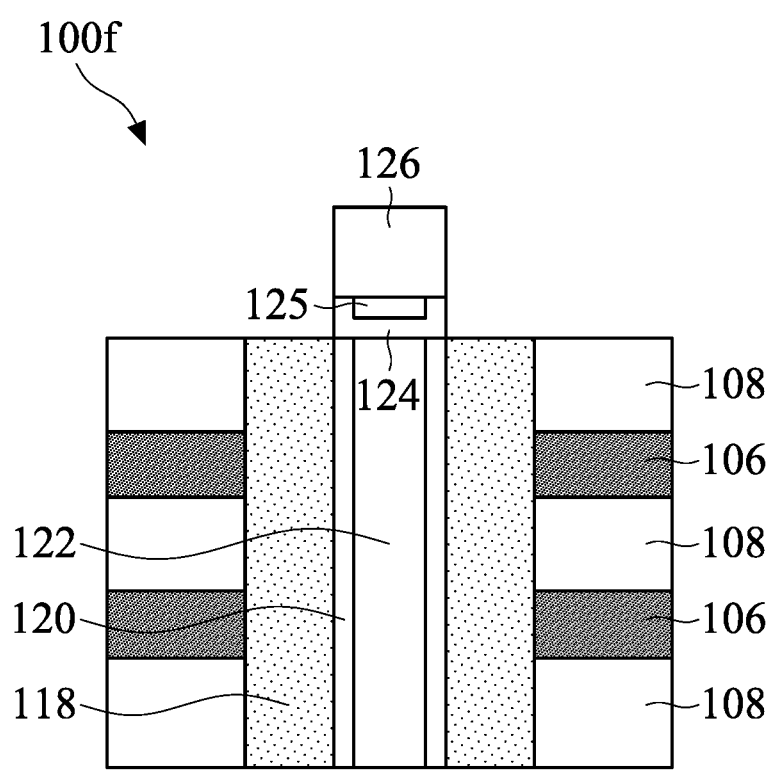
FIG. 7 shows a cross-sectional representation of a semiconductor device structure, in accordance with some embodiments of the disclosure.

FIG. 7 shows a cross-sectional representation of a semiconductor device structure 100f, in accordance with some embodiments of the disclosure. The semiconductor structure 100f of FIG. 7 is similar to, or the same as, the semiconductor structure 100c of FIG. 4H, the difference is that bottom surface of the etching stop layer 124 is planar, and the top surface of the etching stop layer 124 is substantially coplanar with the top surface of the core layer 125.

The formation of the etching stop layer 124 is used to protect the underlying layers from being damaged by the etching process. Since the etching stop layer 124 and the cap layer 126 have different etching selectivity, the etching stop layer 124 is not removed while the cap layer 126 is removed, and therefore the etching process window is enlarged. Furthermore, the uniformity of the first dummy fin structure 134a is improved. In addition, the core shell structure is formed by the core layer 125 is surrounded by the etching stop layer 124 and the cap layer 126. The unwanted capacitor (Ceff) is reduced to improve the performance of the semiconductor device structure.

Embodiments for forming a semiconductor device structure and method for formation the same are provided. A first fin structure and a second fin structure are formed over a substrate. The first fin structure includes a number of nanostructures, and the second fin structure includes a number of nanostructures. A dummy fin structure is between the first fin structure and the second fin structure. The dummy fin structure includes a bottom portion, an etching stop layer and a top portion. The bottom portion includes a liner layer and a filling layer over the liner layer, and the top portion is a cap layer made of high-k dielectric layer. The etching stop layer protects the underlying layers from damage and enlarges the etching window. In addition, the etching stop layer and the cap layer have different etching selectivity. The etching stop layer is not removed when the cap layer is removed. Therefore, the uniformity of the dummy fin structure is improved, and the performance of semiconductor device structure is improved.

In some embodiments, a semiconductor device structure is provided. The semiconductor device structure includes a first fin structure formed over a substrate, and the first fin structure includes a plurality of first nanostructures stacked in a vertical direction. The semiconductor device structure further includes a second fin structure formed over the substrate, and the second fin structure includes a plurality of second nanostructures stacked in a vertical direction. The semiconductor device structure further includes a dummy fin structure between the first fin structure and the second fin structure. The dummy fin structure includes a first etching stop layer between a bottom portion and a top portion.

In some embodiments, a semiconductor device structure is provided. The semiconductor device structure includes a first fin structure formed over a substrate, and the first fin structure includes a plurality of first nanostructures stacked in a vertical direction. The semiconductor device structure also includes a second fin structure formed over the second region, and the second fin structure includes a plurality of second nanostructures stacked in a vertical direction. The semiconductor device structure includes a first gate structure surrounding the first nanostructures, and a second gate structure surrounding the second nanostructures. The semiconductor device structure further includes a first dummy fin structure formed between the first gate structure and the second gate structure. The first dummy fin structure includes a bottom portion, a middle portion, and a top portion over the middle portion, wherein the top portion includes a high-k dielectric layer. The middle portion includes a core layer surrounded by a first etching stop layer.

In some embodiments, a method for forming a semiconductor device structure is provided. The method includes forming a first fin structure and a second fin structure over a substrate, and the first fin structure includes a plurality of first nanostructures stacked in a vertical direction, and the second fin structure includes a plurality of second nanostructures stacked in a vertical direction. The method also includes forming a first dummy fin structure between the first fin structure and a portion of the second fin structure, and the first dummy fin structure includes a first etching stop layer between a bottom portion and a top portion. The method also includes forming a dummy gate structure over the first fin structure, the second fin structure and the first dummy fin structure. The method includes removing a portion of the first fin structure and a second fin structure to form a first recess and a second recess. The method includes forming a first source/drain (S/D) structure and a second S/D structure in the first recess and the second recess, and the first dummy fin structure is between the first S/D structure and the second S/D structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first fin structure formed over a substrate, wherein the first fin structure comprises a plurality of first nanostructures stacked in a vertical direction;
a second fin structure formed over the substrate, wherein the second fin structure comprises a plurality of second nanostructures stacked in a vertical direction; and
a dummy fin structure between the first fin structure and the second fin structure, wherein the dummy fin structure comprises a first etching stop layer between a bottom portion and a top portion, wherein the first etching stop layer has a recessed bottom surface.

2. The semiconductor device structure as claimed in claim 1, wherein the dielectric constant of the top portion is higher than the dielectric constant of the bottom portion.

3. The semiconductor device structure as claimed in claim 1, wherein the bottom portion comprises a liner layer and a filling layer formed over the liner layer.

4. The semiconductor device structure as claimed in claim 1, further comprising:
a first gate structure surrounding the first nanostructures; and
a second gate structure surrounding the second nanostructures, wherein the dummy fin structure is between the first gate structure and the second gate structure.

5. The semiconductor device structure as claimed in claim 4, further comprising:
a first S/D structure formed adjacent to the first gate structure; and
an inner spacer between the first gate structure and the first S/D structure, wherein a top surface of the first etching stop layer is higher than a topmost surface of the inner spacer.

6. The semiconductor device structure as claimed in claim 5, further comprising:
a second etching stop layer formed over the first S/D structure, wherein the second etching stop layer is in direct contact with the first etching stop layer.

7. The semiconductor device structure as claimed in claim 1, further comprising:
a core layer surrounded by the first etching stop layer.

8. The semiconductor device structure as claimed in claim 1, further comprising:
an isolation structure formed over the substrate, wherein the isolation structure has a first width, the dummy fin structure has a second width, and the first width is greater than the second width.

9. The semiconductor device structure as claimed in claim 1, wherein a top surface of the first etching stop layer is higher than a topmost first nanostructure.

10. The semiconductor device structure as claimed in claim 1, wherein the top portion of the dummy fin structure has a recessed bottom surface.

11. A semiconductor device structure, comprising:
a first fin structure formed over a substrate, wherein the first fin structure comprises a plurality of first nanostructures stacked in a vertical direction;
a second fin structure formed over the substrate, wherein the second fin structure comprises a plurality of second nanostructures stacked in a vertical direction;
a first gate structure surrounding the first nanostructures;
a second gate structure surrounding the second nanostructures; and
a first dummy fin structure formed between the first gate structure and the second gate structure, wherein the first dummy fin structure comprises:
a bottom portion;
a middle portion, wherein the middle portion comprises a core layer surrounded by a first etching stop layer; and
a top portion over the middle portion, wherein the top portion comprises a high-k dielectric layer.

12. The semiconductor device structure as claimed in claim 11, further comprising:
a second dummy fin structure formed adjacent to the second fin structure, wherein a top surface of the first dummy fin structure is higher than a top surface of the second dummy fin structure.

13. The semiconductor device structure as claimed in claim 11, wherein a top surface of the first etching stop layer is higher than a topmost first nanostructure.

14. The semiconductor device structure as claimed in claim 13, wherein a top surface of the core layer is higher than a top surface of the first etching stop layer.

15. The semiconductor device structure as claimed in claim 11, further comprising:
a first S/D structure formed adjacent to the first gate structure; and
an inner spacer between the first gate structure and the first S/D structure, wherein a top surface of the first etching stop layer is higher than a topmost surface of the inner spacer.

16. The semiconductor device structure as claimed in claim 11, wherein the first gate structure comprises an interfacial layer, and the interfacial layer is in direct contact with the first etching stop layer.

17. A method for forming a semiconductor device structure, comprising:
forming a first fin structure and a second fin structure over a substrate, wherein the first fin structure comprises a plurality of first nanostructures stacked in a vertical direction, and the second fin structure comprises a plurality of second nanostructures stacked in a vertical direction;
forming a first dummy fin structure between the first fin structure and a portion of the second fin structure, wherein the first dummy fin structure comprises a first etching stop layer between a bottom portion and a top portion;
forming a dummy gate structure over the first fin structure, the second fin structure and the first dummy fin structure;
removing a portion of the first fin structure and a second fin structure to form a first recess and a second recess;
forming a first source/drain (S/D) structure and a second S/D structure in the first recess and the second recess, wherein the first dummy fin structure is between the first S/D structure and the second S/D structure; and
forming a second dummy fin structure adjacent to the second nanostructures, wherein a top surface of the first dummy fin structure is higher than a top surface of the second dummy fin structure.

18. The method for forming the semiconductor device structure as claimed in claim 17, wherein forming the first dummy fin structure between the first fin structure and the second fin structure comprises:

forming a bottom portion between the first fin structure and the second fin structure, wherein the bottom portion comprises a liner layer and a filling layer formed over the liner layer;

forming the first etching stop layer over the bottom portion; and forming a top portion over the first etching stop layer, wherein the top portion comprises a high-k dielectric layer.

19. The method for forming the semiconductor device structure as claimed in claim 17, wherein the first nanostructures comprise a plurality of first semiconductor layers and a plurality of second semiconductor layers alternately stacked, wherein the method further comprises:

removing a portion of the first semiconductor layers to form a recess; and forming an inner spacer in the recess, wherein a top surface of the first etching stop layer is higher than a topmost surface of the inner spacer.

20. The method for forming the semiconductor device structure as claimed in claim 17, further comprising:

forming a second etching stop layer over the first S/D structure, wherein the second etching stop layer is in direct contact with the first etching stop layer.

* * * * *